(12) United States Patent
Bamnolker et al.

(10) Patent No.: US 9,978,605 B2
(45) Date of Patent: *May 22, 2018

(54) METHOD OF FORMING LOW RESISTIVITY FLUORINE FREE TUNGSTEN FILM WITHOUT NUCLEATION

(71) Applicant: Lam Research Corporation, Fremont, CA (US)

(72) Inventors: Hanna Bamnolker, Cupertino, CA (US); Joshua Collins, Sunnyvale, CA (US); Tomas Sadilek, San Jose, CA (US); Hyeong Seop Shin, Suwon (KR); Xiaolan Ba, San Jose, CA (US); Raashina Humayun, Los Altos, CA (US); Michal Danek, Cupertino, CA (US); Lawrence Schloss, Palo Alto, CA (US)

(73) Assignee: Lam Research Corporation, Fremont, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/398,462

(22) Filed: Jan. 4, 2017

(65) Prior Publication Data
US 2017/0117155 A1    Apr. 27, 2017

Related U.S. Application Data

(63) Continuation-in-part of application No. 14/723,270, filed on May 27, 2015, now Pat. No. 9,613,818.

(51) Int. Cl.
*H01L 21/285*    (2006.01)
*H01L 27/115*    (2017.01)
(Continued)

(52) U.S. Cl.
CPC .... *H01L 21/28556* (2013.01); *C23C 16/0281* (2013.01); *C23C 16/045* (2013.01);
(Continued)

(58) Field of Classification Search
None
See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| CN | 1115723 C | 7/2003 |
| CN | 101308794 A | 11/2008 |

(Continued)

OTHER PUBLICATIONS

U.S. Office Action, dated Apr. 7, 2014, issued in U.S. Appl. No. 13/633,502.

(Continued)

*Primary Examiner* — Asok K Sarkar
(74) *Attorney, Agent, or Firm* — Weaver Austin Villeneuve & Sampson LLP

(57) ABSTRACT

Provided herein are methods of depositing fluorine-free tungsten by sequential CVD pulses, such as by alternately pulsing a chlorine-containing tungsten precursor and hydrogen in cycles of temporally separated pulses, without depositing a tungsten nucleation layer. Methods also include depositing tungsten directly on a substrate surface using alternating pulses of a chlorine-containing tungsten precursor and hydrogen without treating the substrate surface.

23 Claims, 15 Drawing Sheets

(51) Int. Cl.
*H01L 21/768* (2006.01)
*C23C 16/52* (2006.01)
*C23C 16/458* (2006.01)
*C23C 16/455* (2006.01)
*C23C 16/02* (2006.01)
*C23C 16/04* (2006.01)
*C23C 16/14* (2006.01)
*H01L 27/11582* (2017.01)

(52) U.S. Cl.
CPC ............ *C23C 16/14* (2013.01); *C23C 16/455* (2013.01); *C23C 16/458* (2013.01); *C23C 16/45523* (2013.01); *C23C 16/52* (2013.01); *H01L 21/28562* (2013.01); *H01L 21/28568* (2013.01); *H01L 21/76876* (2013.01); *H01L 21/76877* (2013.01); *H01L 27/11582* (2013.01)

(56) References Cited

U.S. PATENT DOCUMENTS

| | | |
|---|---|---|
| 4,874,719 A | 10/1989 | Kurosawa |
| 4,962,063 A | 10/1990 | Maydan et al. |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,633,200 A | 5/1997 | Hu |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,916,634 A | 6/1999 | Fleming et al. |
| 5,926,720 A | 7/1999 | Zhao et al. |
| 5,956,609 A | 9/1999 | Lee et al. |
| 5,963,833 A | 10/1999 | Thakur |
| 5,994,749 A | 11/1999 | Oda |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,162,715 A | 12/2000 | Mak et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,260,266 B1 | 7/2001 | Tamaki |
| 6,265,312 B1 | 7/2001 | Sidhwa et al. |
| 6,277,744 B1 | 8/2001 | Yuan et al. |
| 6,284,316 B1 | 9/2001 | Sandhu et al. |
| 6,287,964 B1 | 9/2001 | Cho |
| 6,287,965 B1 | 9/2001 | Kang et al. |
| 6,294,468 B1 | 9/2001 | Gould-Choquette et al. |
| 6,297,152 B1 | 10/2001 | Itoh et al. |
| 6,306,211 B1 | 10/2001 | Takahashi et al. |
| 6,309,964 B1 | 10/2001 | Tsai et al. |
| 6,309,966 B1 | 10/2001 | Govindarajan et al. |
| 6,310,300 B1 | 10/2001 | Cooney et al. |
| 6,340,629 B1 | 1/2002 | Yeo et al. |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,491,978 B1 | 12/2002 | Kalyanam |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,585 B2 | 5/2004 | Yoon et al. |
| 6,777,331 B2 | 8/2004 | Nguyen |
| 6,797,340 B2 | 9/2004 | Fang et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,338,900 B2 | 3/2008 | Mizuno et al. |
| 7,355,254 B2 | 4/2008 | Datta et al. |
| 7,405,158 B2 | 7/2008 | Lai et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,964,505 B2 | 6/2011 | Khandelwal et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,071,478 B2 | 12/2011 | Wu et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,119,527 B1 | 2/2012 | Chandrashekar et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,696,921 B2 | 4/2014 | Park et al. |
| 8,709,948 B2 | 4/2014 | Danek et al. |
| 8,853,080 B2 | 10/2014 | Guan et al. |
| 8,975,184 B2 | 3/2015 | Chen et al. |

(56) References Cited

U.S. PATENT DOCUMENTS

| | | |
|---|---|---|
| 8,993,055 B2 | 3/2015 | Rahtu et al. |
| 9,034,760 B2 | 5/2015 | Chen et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,230,815 B2 | 1/2016 | Fu et al. |
| 9,236,297 B2 | 1/2016 | Chen et al. |
| 9,240,347 B2 | 1/2016 | Chandrashekar et al. |
| 9,583,385 B2 | 2/2017 | Lee et al. |
| 9,589,808 B2 | 3/2017 | Bamnolker et al. |
| 9,595,470 B2 | 3/2017 | Bamnolker et al. |
| 9,613,818 B2 * | 4/2017 | Ba .................. H01L 21/28556 |
| 9,653,353 B2 | 5/2017 | Chandrashekar et al. |
| 9,673,146 B2 | 6/2017 | Chen et al. |
| 9,754,824 B2 | 9/2017 | Schloss et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0117399 A1 | 8/2002 | Chen et al. |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2003/0013300 A1 | 1/2003 | Byun |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190424 A1 | 10/2003 | Sneh |
| 2003/0190802 A1 | 10/2003 | Wang et al. |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0009325 A1 | 1/2005 | Chung et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0191803 A1 | 9/2005 | Matsuse et al. |
| 2006/0003581 A1 | 1/2006 | Johnston et al. |
| 2006/0040052 A1 * | 2/2006 | Fang .................. C23C 16/02 427/248.1 |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2007/0264105 A1 | 11/2007 | Pharand et al. |
| 2008/0017891 A1 | 1/2008 | Datta et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2008/0283844 A1 | 11/2008 | Hoshi et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0120245 A1 | 5/2010 | Tjandra et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0156154 A1 | 6/2011 | Hoentschel et al. |
| 2011/0159690 A1 | 6/2011 | Chandrashekar et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2011/0281438 A1 | 11/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0120723 A1 | 5/2014 | Fu et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0050807 A1 | 2/2015 | Wu et al. |
| 2015/0056803 A1 | 2/2015 | Chandrashekar et al. |
| 2015/0179461 A1 | 6/2015 | Bamnolker et al. |
| 2015/0279732 A1 | 10/2015 | Lee et al. |
| 2015/0325475 A1 | 11/2015 | Bamnolker et al. |
| 2015/0348840 A1 | 12/2015 | Bamnolker et al. |
| 2016/0118345 A1 | 4/2016 | Chen et al. |
| 2016/0190008 A1 | 6/2016 | Chandrashekar et al. |
| 2016/0233220 A1 | 8/2016 | Danek et al. |
| 2016/0293467 A1 | 10/2016 | Caveney et al. |
| 2016/0336222 A1 * | 11/2016 | Knapp ............... H01L 21/76876 |
| 2016/0351401 A1 | 12/2016 | Ba et al. |
| 2016/0351444 A1 | 12/2016 | Schloss et al. |
| 2017/0053811 A1 | 2/2017 | Fung et al. |
| 2017/0133231 A1 | 5/2017 | Bamnolker et al. |

FOREIGN PATENT DOCUMENTS

| | | |
|---|---|---|
| CN | 101952945 A | 1/2011 |
| CN | 103125013 A | 5/2013 |
| EP | 0 437 110 | 7/1991 |

(56) References Cited

FOREIGN PATENT DOCUMENTS

| | | |
|---|---|---|
| EP | 1 156 132 | 11/2001 |
| EP | 1 179 838 | 2/2002 |
| JP | S5629648 A | 3/1981 |
| JP | H2-187031 A | 7/1990 |
| JP | H4-142061 A | 5/1992 |
| JP | H5-226280 A | 9/1993 |
| JP | H7-147321 A | 6/1995 |
| JP | H07-226393 | 8/1995 |
| JP | 08-115984 | 5/1996 |
| JP | 09-022896 A | 1/1997 |
| JP | 09-027596 | 1/1997 |
| JP | H10-144688 | 5/1998 |
| JP | H10-163132 | 6/1998 |
| JP | 2966406 | 10/1999 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-016066 A | 1/2002 |
| JP | 2002-124488 | 4/2002 |
| JP | 2003-193233 | 7/2003 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-533877 | 9/2009 |
| JP | 2009-540123 | 11/2009 |
| JP | 2010-251760 A | 11/2010 |
| JP | 2011-035366 A | 2/2011 |
| KR | 100272523 | 12/2000 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 10-2007-705936 | 4/2007 |
| KR | 10-2008-0036679 | 4/2008 |
| KR | 10-2008-0110897 | 12/2008 |
| KR | 10-2009-0103815 | 10/2009 |
| TW | 310461 | 7/1997 |
| TW | 452607 | 9/2001 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148880 | 10/2013 |
| WO | WO 2014/058536 | 4/2014 |

OTHER PUBLICATIONS

U.S. Final Office Action, dated Nov. 5, 2014, issued in U.S. Appl. No. 13/633,502.
U.S. Notice of Allowance, dated Mar. 2, 2015, issued in U.S. Appl. No. 13/633,502.
U.S. Notice of Allowance (Supplemental Notice of Allowability), dated Apr. 16, 2015, issued in U.S. Appl. No. 13/633,502.
U.S. Office Action, dated Jan. 12, 2016, issued in U.S. Appl. No. 14/738,685.
U.S. Final Office Action, dated Jul. 25, 2016, issued in U.S. Appl. No. 14/738,685.
U.S. Notice of Allowance, dated Oct. 13, 2016, issued in U.S. Appl. No. 14/738,685.
U.S. Office Action, dated May 30, 2014, issued in U.S. Appl. No. 13/862,048.
U.S. Final Office Action, dated Oct. 16, 2014, issued in U.S. Appl. No. 13/862,048.
U.S. Notice of Allowance, dated Apr. 28, 2015, issued in U.S. Appl. No. 13/862,048.
U.S. Notice of Allowance, dated Jun. 17, 2015, issued in U.S. Appl. No. 13/862,048.
U.S. Office Action, dated May 6, 2015, issued in U.S. Appl. No. 14/135,375.
U.S. Final Office Action, dated Sep. 29, 2015, issued in U.S. Appl. No. 14/135,375.
U.S. Office Action, dated Jan. 21, 2016, issued in U.S. Appl. No. 14/135,375.
U.S. Final Office Action, dated May 31, 2016, issued in U.S. Appl. No. 14/135,375.
U.S. Notice of Allowance, dated Oct. 25, 2016, issued in U.S. Appl. No. 14/135,375.
U.S. Office Action, dated Dec. 11, 2014, issued in U.S. Appl. No. 14/173,733.
U.S. Notice of Allowance, dated Jun. 2, 2015, issued in U.S. Appl. No. 14/173,733.
U.S. Office Action, dated Aug. 18, 2016, issued in U.S. Appl. No. 15/040,561.
U.S. Final Office Action, dated Dec. 30, 2016, issued in U.S. Appl. No. 15/040,561.
U.S. Office Action, dated Jul. 17, 2017, issued in U.S. Appl. No. 15/040,561.
U.S. Office Action, dated Feb. 1, 2016, issued in U.S. Appl. No. 14/723,275.
U.S. Office Action, dated Jul. 28, 2016, issued in U.S. Appl. No. 14/723,275.
U.S. Final Office Action, dated Jan. 20, 2017, issued in U.S. Appl. No. 14/723,275.
U.S. Notice of Allowance, dated May 4, 2017, issued in U.S. Appl. No. 14/723,275.
U.S. Office Action, dated Jul. 12, 2016, issued in U.S. Appl. No. 14/723,270.
U.S. Notice of Allowance, dated Nov. 18, 2016, issued in U.S. Appl. No. 14/723,270.
U.S. Office Action, dated Jul. 17, 2002, issued in U.S. Appl. No. 09/975,074.
U.S. Notice of Allowance, dated Mar. 12, 2003, issued in U.S. Appl. No. 09/975,074.
U.S. Office Action, dated Feb. 8, 2005, issued in U.S. Appl. No. 10/649,351.
U.S. Final Office Action, dated Jul. 14, 2005, issued in U.S. Appl. No. 10/649,351.
U.S. Office Action, dated Dec. 30, 2005, issued in U.S. Appl. No. 10/649,351.
U.S. Notice of Allowance, dated Jul. 21, 2006, issued in U.S. Appl. No. 10/649,351.
U.S. Office Action, dated Jun. 22, 2004, issued in U.S. Appl. No. 10/435,010.
U.S. Notice of Allowance, dated Oct. 7, 2004, issued in U.S. Appl. No. 10/435,010.
U.S. Notice of Allowance, dated Jan. 19, 2005, issued in U.S. Appl. No. 10/435,010.
U.S. Office Action, dated Nov. 23, 2005, issued in U.S. Appl. No. 10/984,126.
U.S. Final Office Action, dated May 17, 2006, issued in U.S. Appl. No. 10/984,126.
U.S. Notice of Allowance, dated Aug. 25, 2006, issued in U.S. Appl. No. 10/984,126.

(56) References Cited

OTHER PUBLICATIONS

U.S. Office Action, dated Mar. 23, 2005, issued in U.S. Appl. No. 10/690,492.
U.S. Notice of Allowance, dated Sep. 14, 2005, issued in U.S. Appl. No. 10/690,492.
U.S. Office Action, dated Jun. 27, 2008, issued in U.S. Appl. No. 11/305,368.
U.S. Office Action, dated Apr. 3, 2009, issued in U.S. Appl. No. 11/305,368.
U.S. Notice of Allowance, dated Nov. 17, 2009, issued in U.S. Appl. No. 11/305,368.
U.S. Office Action, dated Jul. 12, 2005, issued in U.S. Appl. No. 10/815,560.
U.S. Final Office Action, dated Dec. 28, 2005, issued in U.S. Appl. No. 10/815,560.
U.S. Office Action, dated Apr. 17, 2006, issued in U.S. Appl. No. 10/815,560.
U.S. Office Action, dated Sep. 28, 2006, issued in U.S. Appl. No. 10/815,560.
U.S. Notice of Allowance dated Apr. 24, 2007, issued in U.S. Appl. No. 10/815,560.
U.S. Office Action, dated Aug. 21, 2008, issued in U.S. Appl. No. 11/265,531.
U.S. Final Office Action, dated Feb. 26, 2009, issued in U.S. Appl. No. 11/265,531.
U.S. Notice of Allowance, dated May 4, 2009, issued in U.S. Appl. No. 11/265,531.
U.S. Office Action, dated Nov. 23, 2010, issued in U.S. Appl. No. 12/538,770.
U.S. Notice of Allowance, dated Jun. 30, 2011, issued in U.S. Appl. No. 12/538,770.
U.S. Office Action, dated Oct. 16, 2008, issued in U.S. Appl. No. 11/349,035.
U.S. Final Office Action, dated Feb. 25, 2009, issued in U.S. Appl. No. 11/349,035.
U.S. Office Action, dated Jun. 4, 2009, issued in U.S. Appl. No. 11/349,035.
U.S. Final Office Action, dated Nov. 20, 2009, issued in U.S. Appl. No. 11/349,035.
U.S. Notice of Allowance, dated Mar. 2, 2010, issued in U.S. Appl. No. 11/349,035.
U.S. Office Action, dated Sep. 29, 2008, issued in U.S. Appl. No. 11/782,570.
U.S. Final Office Action, dated Apr. 28, 2009, issued in U.S. Appl. No. 11/782,570.
U.S. Notice of Allowance, dated Sep. 17, 2009, issued in U.S. Appl. No. 11/782,570.
U.S. Office Action, dated Jan. 25, 2011, issued in U.S. Appl. No. 12/636,616.
U.S. Final Office Action, dated Jun. 15, 2011, issued in U.S. Appl. No. 12/636,616.
U.S. Notice of Allowance, dated Sep. 30, 2011, issued in U.S. Appl. No. 12/636,616.
U.S. Office Action, dated Jun. 24, 2009, issued in U.S. Appl. No. 12/030,645.
U.S. Final Office Action, dated Jan. 13, 2010, issued in U.S. Appl. No. 12/030,645.
U.S. Final Office Action, dated Jul. 23, 2010, issued in U.S. Appl. No. 12/030,645.
U.S. Notice of Allowance and Fee Due, dated Jan. 24, 2011, issued in U.S. Appl. No. 12/030,645.
U.S. Office Action, dated Aug. 6, 2012, issued in U.S. Appl. No. 13/095,734.
Notice of Allowance dated Dec. 3, 2012, issued in U.S. Appl. No. 13/095,734.
U.S. Office Action, dated Aug. 5, 2009, issued in U.S. Appl. No. 11/951,236.
U.S. Final Office Action, dated Jan. 26, 2010 from U.S. Appl. No. 11/951,236.
U.S. Notice of Allowance, dated Apr. 6, 2010, issued in U.S. Appl. No. 11/951,236.
U.S. Office Action, dated Jun. 30, 2011, issued in U.S. Appl. No. 12/829,119.
U.S. Final Office Action, dated Nov. 17, 2011, issued in U.S. Appl. No. 12/829,119.
U.S. Office Action, dated Apr. 19, 2012, issued in U.S. Appl. No. 12/829,119.
U.S. Notice of Allowance, dated Aug. 7, 2012, issued in U.S. Appl. No. 12/829,119.
U.S. Office Action, dated Jun. 11, 2009, issued in U.S. Appl. No. 11/963,698.
U.S. Final Office Action, dated Dec. 9, 2009, issued in U.S. Appl. No. 11/963,698.
U.S. Office Action, dated Jun. 11, 2010, issued in U.S. Appl. No. 11/963,698.
U.S. Final Office Action, dated Dec. 30, 2010, issued in U.S. Appl. No. 11/963,698.
U.S. Notice of Allowance, dated Sep. 2, 2011, issued in U.S. Appl. No. 11/963,698.
U.S. Office Action, dated Apr. 16, 2012, issued in U.S. Appl. No. 13/276,170.
U.S. Notice of Allowance, dated Oct. 4, 2012, issued in U.S. Appl. No. 13/276,170.
U.S. Notice of Allowance, dated Jul. 25, 2011, issued in U.S. Appl. No. 12/363,330.
U.S. Office Action dated Oct. 21, 2009, issued in U.S. Appl. No. 12/202,126.
U.S. Final Office Action, dated May 7, 2010, issued in U.S. Appl. No. 12/202,126.
U.S. Office Action, dated Jul. 26, 2010 issued in U.S. Appl. No. 12/202,126.
U.S. Final Office Action, dated Feb. 7, 2011, issued in U.S. Appl. No. 12/202,126.
U.S. Office Action, dated Jan. 7, 2013, issued in U.S. Appl. No. 12/202,126.
U.S. Notice of Allowance, dated Jun. 7, 2013, issued in U.S. Appl. No. 12/202,126.
U.S. Office Action, dated May 3, 2010, issued in U.S. Appl. No. 12/407,541.
U.S. Final Office Action, dated Oct. 19, 2010, issued in U.S. Appl. No. 12/407,541.
U.S. Office Action, dated May 2, 2011, issued in U.S. Appl. No. 12/407,541.
U.S. Notice of Allowance, dated Sep. 19, 2011, issued in U.S. Appl. No. 12/407,541.
U.S. Office Action, dated Mar. 6, 2012, issued in U.S. Appl. No. 13/244,016.
U.S. Notice of Allowance dated Nov. 29, 2012, issued in U.S. Appl. No. 13/244,016.
U.S. Office Action, dated Jun. 14, 2011, issued in U.S. Appl. No. 12/556,490.
U.S. Notice of Allowance, dated Mar. 2, 2012, issued in U.S. Appl. No. 12/556,490.
U.S. Office Action, dated May 13, 2011, issued in U.S. Appl. No. 12/755,248.
U.S. Office Action, dated Oct. 28, 2011, issued in U.S. Appl. No. 12/755,248.
U.S. Final Office Action, dated Apr. 30, 2012, issued in U.S. Appl. No. 12/755,248.
U.S. Office Action, dated Feb. 15, 2013, issued in U.S. Appl. No. 12/755,248.
U.S. Office Action dated Dec. 18, 2012, issued in U.S. Appl. No. 12/723,532.
U.S. Office Action dated Jul. 18, 2013, issued in U.S. Appl. No. 12/723,532.
U.S. Notice of Allowance dated Dec. 24, 2013, issued in U.S. Appl. No. 12/723,532.
U.S. Office Action, dated Feb. 16, 2012, issued in U.S. Appl. No. 12/755,259.
U.S. Final Office Action, dated Sep. 12, 2012, issued in U.S. Appl. No. 12/755,259.

(56) References Cited

OTHER PUBLICATIONS

U.S. Notice of Allowance, dated Jul. 10, 2013, issued in U.S. Appl. No. 12/755,259.
U.S. Notice of Allowance dated Sep. 4, 2013 issued in U.S. Appl. No. 12/755,259.
U.S. Office Action, dated Dec. 18, 2014, issued in U.S. Appl. No. 14/097,160.
U.S. Final Office Action, dated Jun. 2, 2015, issued in U.S. Appl. No. 14/097,160.
U.S. Notice of Allowance, dated Sep. 9, 2015, issued in U.S. Appl. No. 14/097,160.
U.S. Office Action, dated Jul. 7, 2016, issued in U.S. Appl. No. 14/989,444.
U.S. Notice of Allowance, dated Jan. 20, 2017, issued in U.S. Appl. No. 14/989,444.
U.S. Office Action, dated May 10, 2012, issued in U.S. Appl. No. 13/020,748.
U.S. Final Office Action, dated Nov. 16, 2012, issued in U.S. Appl. No. 13/020,748.
U.S. Office Action, dated Feb. 24, 2014, issued in U.S. Appl. No. 13/020,748.
U.S. Final Office Action, dated Jul. 2, 2014, issued in U.S. Appl. No. 13/020,748.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Sep. 18, 2014, issued in U.S. Appl. No. 13/928,216.
U.S. Notice of Allowance, dated Jan. 22, 2015, issued in U.S. Appl. No. 13/928,216.
U.S. Office Action, dated Jun. 20, 2013, issued in U.S. Appl. No. 13/560,688.
U.S. Final Office Action, dated Feb. 14, 2014, issued in U.S. Appl. No. 13/560,688.
U.S. Notice of Allowance, dated Nov. 4, 2014, issued in U.S. Appl. No. 13/560,688.
U.S. Office Action, dated May 29, 2015, issued in U.S. Appl. No. 13/949,092.
U.S. Final Office Action, dated Jan. 14, 2016, issued in U.S. Appl. No. 13/949,092.
U.S. Office Action, dated Sep. 19, 2016, issued in U.S. Appl. No. 13/949,092.
U.S. Final Office Action, dated May 18, 2017, issued in U.S. Appl. No. 13/949,092.
U.S. Office Action, dated Jun. 14, 2013, issued in U.S. Appl. No. 13/633,798.
U.S. Final Office Action, dated Nov. 26, 2013, issued in U.S. Appl. No. 13/633,798.
U.S. Notice of Allowance, dated May 23, 2014, issued in U.S. Appl. No. 13/633,798.
Taiwan Examination Report, dated Jun. 22, 2017, issued in Application No. TW 103113287.
Chinese First Office Action dated Jun. 2, 2017 issued in Application No. CN 201410856793.7.
PCT Search Report and Written Opinion, dated Jan. 19, 2005, issued in PCT/US2004/006940.
Korean First Notification of Provisional Rejection, dated Dec. 8, 2010, issued in Application No. KR 2004-0036346.
Korean Office Action, dated Jun. 13, 2011, issued in Application No. KR 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. CN 200980133560.1.
Chinese Second Office Action dated Aug. 7, 2013 issued in Application No. CN 200980133560.1.
Chinese Third Office Action dated Apr. 22, 2014 issued in Application No. CN 200980133560.1.
Chinese Fourth Office Action dated Jan. 5, 2015 issued in Application No. CN 200980133560.1.
Chinese Fifth Office Action dated May 5, 2015 issued in Application No. CN 200980133560.1.
Japanese Office Action dated Dec. 3, 2013 issued in Application No. JP 2011-525228.
Korean Office Action dated Sep. 6, 2012 issued in Application No. KR 2011-7004322.
Korean Office Action dated Jul. 19, 2013 issued in Application No. KR 2011-7004322.
Korean Office Action dated Nov. 4, 2013 issued in Application No. KR 10-2013-7027117.
Korean Office Action dated Jun. 17, 2014 issued in Application No. KR 10-2013-7027117.
Japanese Office Action dated Jun. 17, 2014 issued in Application No. JP 2010-055163.
Korean Office Action dated Mar. 21, 2013 issued in Application No. KR 10-2010-0024905.
Taiwan Office Action dated Jun. 8, 2015 issued in Application No. TW 099107504.
Korean Notification of Provisional Rejection dated Jul. 17, 2012, issued in Application No. KR 2010-0087997.
Taiwan Office Action and Search Report dated Feb. 12, 2015 issued in Application No. TW 099130354.
Taiwan Office Action (Rejection Decision) dated Oct. 28, 2015 issued in Application No. TW 099130354.
Taiwan Search Report dated Nov. 30, 2016 issued in Application No. TW 099130354.
Japanese Office Action dated Mar. 4, 2014 issued in Application No. JP 2010-093522.
Korean Office Action dated Mar. 4, 2013 in Application No. KR 2010-0035449.
Taiwan Office Action dated Dec. 27, 2014 issued in Application No. TW 099111860.
Japanese Office Action dated Jul. 29, 2014 issued in Application No. JP 2010-093544.
Korean Second Office Action dated Jan. 25, 2014 in Application No. KR 10-2010-0035453.
Korean First Office Action dated Jul. 10, 2015 issued in Application No. KR 10-2014-0090283.
Taiwan Office Action dated Aug. 4, 2015 issued in Application No. TW 099111859.
Taiwan Office Action dated Jan. 10, 2017 issued in Application No. TW 105105984.
PCT International Search Report and Written Opinion, dated Jul. 26, 2013, issued in PCT/US2013/034167.

(56) References Cited

OTHER PUBLICATIONS

PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
Taiwan Examination Report dated Dec. 26, 2016 issued in Application No. TW 102123248.
Taiwan Examination Report dated Oct. 26, 2016 issued in Application No. TW 102126976.
Chinese First Office Action dated Sep. 6, 2015 issued in Application No. CN 201310320848.8.
Chinese Second Office Action dated May 16, 2016 issued in Application No. CN 201310320848.8.
Taiwan Examination Report dated Oct. 26, 2016 issued in Application No. TW 102126696.
Taiwan Examination Report dated Mar. 16, 2017 issued in Application No. TW 102132433.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], *Materials Transactions*, 43(7):1585-1592.
Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$ Thin Films by ALCVD™ Method for Diffusion Barriers in Metallization," *IITC Conference Report*, 3 pp.
Manik. P, et al. (2012) "Fermi-level unpinning and low resistivity in contacts to n-type Ge with a thin ZnO interfacial layer," *App. Phys. Lett.* 101:182105-5.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
U.S. Office Action dated May 18, 2016 issued in U.S. Appl. No. 14/703,732.
U.S. Notice of Allowance dated Nov. 1, 2016 issued in U.S. Appl. No. 14/703,732.
U.S. Office Action dated Oct. 4, 2016 issued in U.S. Appl. No. 14/723,353.
U.S. Final Office Action dated Feb. 21, 2017 issued in U.S. Appl. No. 14/723,353.
Chinese First Office Action, dated Jun. 1, 2017, issued in Application No. CN 201510236179.5.
Ammerlaan et al.(1991) "Chemical vapour deposition of tungsten by $H_2$ reduction of $WCl_6$," *Applied Surface Science*, 53:24-29.
Ammerlaan et al. (Feb. 28, 1994) Thesis: "Kinetics and Characterization of Tungsten CVD Processes," *Delft University Press*, 180 pp.
Melliar-Smith et al. (Feb. 1974) "Chemically Vapor Deposited Tungsten for Semiconductor Metallizations," *J. Electrochem. Soc.* 121(2):298-303.
Pons et al. (2000) "Combined thermodynamic and mass transport modeling for material processing from the vapor phase," *Thin Solid Films*, 365:264-274.
Landingham et al. (Feb. 22, 1969) "Fine-Grain Tungsten by Chemical Vapor Deposition," *Journal of the Less-Common Metals, Elsevier Sequoia S.A., Lausanne- Printed in The Netherlands*, 18:229-243.
Saeki et al. (1973) "Reaction process between tungsten hexachloride and hydrogen," *Journal of the Less-Common Metals, Elsevier Sequoia S.A., Lausanne—Printed in The Netherland*, 33:313-316.
U.S. Appl. No. 13/758,928, filed Feb. 4, 2013, Humayun et al.
U.S. Office Action dated Nov. 6, 2017 issued in U.S. Appl. No. 14/723,353.
U.S. Notice of Allowance, dated Dec. 19, 2017, issued in U.S. Appl. No. 15/040,561.
U.S. Notice of Allowance, dated Jan. 12, 2018, issued in U.S. Appl. No. 13/949,092.
Chinese First Office Action dated Sep. 29, 2017 issued in Application No. CN 201510293342.1.

\* cited by examiner

FIG. 1B   FIG. 1C

Constrictions
151

METHOD OF FORMING LOW RESISTIVITY FLUORINE FREE TUNGSTEN FILM WITHOUT NUCLEATION

CROSS-REFERENCE TO RELATED APPLICATION

This application is a continuation-in-part of U.S. patent application Ser. No. 14/723,270, filed May 27, 2015, and titled "DEPOSITION OF LOW FLUORINE TUNGSTEN BY SEQUENTIAL CVD PROCESS," which is incorporated by reference herein in its entirety and for all purposes.

BACKGROUND

Deposition of tungsten-containing materials is an integral part of many semiconductor fabrication processes. These materials may be used for horizontal interconnects, vias between adjacent metal layers, contacts between metal layers and devices on the silicon substrate, and high aspect ratio features. In a conventional tungsten deposition process on a semiconductor substrate, the substrate is heated to the process temperature in a vacuum chamber, and a very thin portion of tungsten film which serves as a seed or nucleation layer is deposited. Thereafter, the remainder of the tungsten film (the bulk layer) is deposited on the nucleation layer by exposing the substrate to two reactants simultaneously. The bulk layer is generally deposited more rapidly than the nucleation layer. However, as devices shrink and more complex patterning schemes are utilized in the industry, deposition of thin tungsten films becomes a challenge.

SUMMARY

Provided herein are methods and apparatuses for processing substrates. One aspect involves a method of filling a feature including: (a) providing a substrate in a chamber, the substrate including the feature having an untreated surface; and (b) without treating the untreated surface of the feature and without depositing a tungsten nucleation layer in the feature, exposing the untreated surface to cycles of alternating pulses of hydrogen and a chlorine-containing tungsten precursor introduced to the chamber to deposit bulk tungsten directly on the untreated surface.

In various embodiments, the chlorine-containing tungsten precursor is tungsten hexachloride. In various embodiments, the chlorine-containing tungsten precursor is tungsten pentachloride.

A pulse of the chlorine-containing tungsten precursor may include between about 0.1% and about 1.5% of chlorine-containing tungsten precursor by volume.

In various embodiments, the chamber is purged between each pulse of the hydrogen and the chlorine-containing tungsten precursor.

Another aspect involves a method of filling a feature including: (a) providing a substrate in a chamber, the substrate including the feature; and (b) exposing the substrate to cycles of alternating pulses of hydrogen and a chlorine-containing tungsten precursor introduced to the chamber to deposit bulk tungsten directly in the feature, whereby the chamber pressure is no more than 10 Torr.

The method may also include (c) prior to exposing the substrate to the alternating pulses of the hydrogen and the chlorine-containing tungsten precursor, exposing the substrate to a reducing agent for a soak treatment.

The method may also include (c) prior to exposing the substrate to the alternating pulses of the hydrogen and the chlorine-containing tungsten precursor, exposing the substrate to alternating pulses of a reducing agent and the chlorine-containing tungsten precursor to deposit a tungsten nucleation layer on the substrate.

In some embodiments, each cycle forms a submonolayer of the bulk tungsten having a thickness of at least about 0.3 Å.

In various embodiments, the chlorine-containing tungsten precursor is tungsten hexachloride. In various embodiments, the chlorine-containing tungsten precursor is tungsten pentachloride.

In some embodiments, the bulk tungsten is deposited at a substrate temperature between about 400° C. and about 600° C.

In various embodiments, the chamber is purged between each pulse of the hydrogen and the chlorine-containing tungsten precursor. Each purge may be performed for a duration between about 0.25 seconds and about 30 seconds.

In various embodiments, a pulse of the chlorine-containing tungsten precursor comprises between about 0.1% and about 1.5% of chlorine-containing tungsten precursor by volume.

Another aspect involves a method of filling a feature including: (a) providing a substrate in a chamber, the substrate including the feature; (b) exposing the substrate to cycles of alternating pulses of hydrogen and a chlorine-containing tungsten precursor introduced to the chamber to deposit bulk tungsten in the feature without depositing a tungsten nucleation layer; and (c) prior to exposing the substrate to the alternating pulses of the hydrogen and the chlorine-containing tungsten precursor, exposing the substrate to a reducing agent for a soak treatment.

In various embodiments, a pulse of the chlorine-containing tungsten precursor comprises between about 0.1% and about 1.5% of chlorine-containing tungsten precursor by volume.

In various embodiments, the bulk tungsten is deposited at a substrate temperature between about 400° C. and about 600° C.

In some embodiments, the chamber is purged between each pulse of the reducing agent and the chlorine-containing tungsten precursor. In some embodiments, each purge is performed for a duration between about 0.25 seconds and about 30 seconds.

Another aspect involves an apparatus for processing substrates, the apparatus including: (a) at least one process chamber including a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for: (i) introducing hydrogen without a chlorine-containing tungsten precursor to the process chamber; and (ii) introducing a chlorine-containing tungsten precursor without hydrogen to the process chamber; whereby the chamber pressure during (i) is no more than 10 Torr.

In some embodiments, the controller further includes machine-readable instructions for (iii) performing (i) and (ii) in cycles of alternating between (i) and (ii), whereby a cycle of includes a pulse of hydrogen and a pulse of the chlorine-containing tungsten precursor.

In various embodiments, the pedestal is set to a temperature between about 400° C. and about 600° C.

In some embodiments, the controller further includes machine-readable instructions for introducing a reducing agent to the substrate for a soak treatment prior to introducing hydrogen and prior to introducing the chlorine-containing tungsten precursor.

In some embodiments, the controller further includes machine-readable instructions for introducing alternating pulses of a reducing agent and the chlorine-containing tungsten precursor to the at least one process chamber to deposit a bulk tungsten layer on the substrate, whereby the reducing agent is selected from the group consisting of silanes, boranes, germanes, and combinations thereof.

These and other aspects are described further below with reference to the drawings.

BRIEF DESCRIPTION OF THE DRAWINGS

FIGS. 1B-1H are schematic examples of various structures in which tungsten may be deposited in accordance with certain disclosed embodiments.

DETAILED DESCRIPTION

Figure 1A:
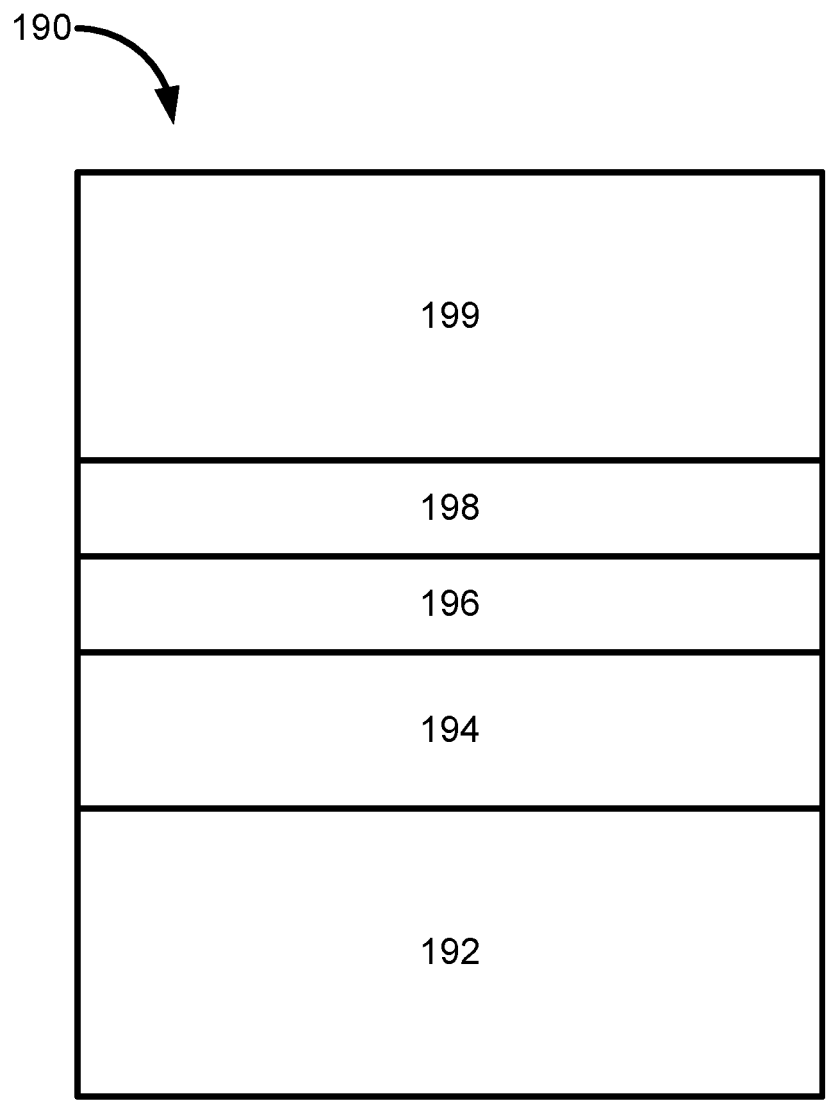
FIG. 1A is a schematic illustration of example films on a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten (W) fill of features is often used in semiconductor device fabrication to form electrical contacts. In conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, chemical vapor deposition (CVD) embodies processes in which reactants are together introduced to a reactor for a vapor-phase reaction. PNL and ALD processes are distinct from CVD processes and vice versa.

After the tungsten nucleation layer is deposited, bulk tungsten is typically deposited by a CVD process by reducing tungsten hexafluoride ($WF_6$) using a reducing agent such as hydrogen ($H_2$). Bulk tungsten is different from a tungsten nucleation layer. Bulk tungsten as used herein refers to tungsten used to fill most or all of a feature, such as at least about 50% of the feature. Unlike a nucleation layer, which is a thin conformal films that serves to facilitate the subsequent formation of a bulk material thereon, bulk tungsten is used to carry current. In various embodiments, bulk tungsten is tungsten deposited to a thickness of at least 50 Å.

There are various challenges in tungsten fill as devices scale to smaller technology nodes and more complex patterning structures are used. Conventional deposition of tungsten has involved the use of the fluorine-containing precursor tungsten hexafluoride ($WF_6$). However, the use of $WF_6$ results in some incorporation of fluorine into the deposited tungsten film. The presence of fluorine can cause electromigration and/or fluorine diffusion into adjacent components and damages contacts, thereby reducing the performance of the device. One challenge is reducing the fluorine concentration or content in the deposited tungsten film. As compared to larger features, a smaller feature having the same fluorine concentration in the tungsten film as a larger feature affects the performance of the device more substantially. For example, the smaller the feature, the thinner the films are deposited. As a result, fluorine in the deposited tungsten film is more likely to diffuse through the thinner films, thereby potentially causing device failure.

One method of preventing fluorine diffusion includes depositing one or more barrier layers prior to depositing tungsten to prevent fluorine from diffusing from tungsten to other layers of the substrate such as an oxide layer. For example, FIG. 1A shows an example stack of layers deposited on a substrate. Substrate 190 includes a silicon layer 192, an oxide layer 194 (e.g., titanium oxide (TiOx), tetraethyl orthosilicate (TEOS) oxide, etc.), a barrier layer 196 (e.g., titanium nitride (TiN)), a tungsten nucleation layer 198, and a bulk tungsten layer 199. Barrier layer 196 is deposited to prevent fluorine diffusion from the bulk tungsten layer 199 and the tungsten nucleation layer 198 to the oxide layer. However, as devices shrink, barrier layers become thinner, and fluorine may still diffuse from the deposited tungsten layers. Although chemical vapor deposition of bulk tungsten performed at a higher temperature results in lower fluorine content, such films have poor step coverage.

Another challenge is reducing resistance in the deposited tungsten films. Thinner films tend to have higher resistance than thicker films. As features become smaller, the tungsten contact or line resistance increases due to scattering effects in the thinner tungsten films. Low resistivity tungsten films minimize power losses and overheating in integrated circuit designs. Tungsten nucleation layers typically have higher electrical resistivities than the overlying bulk layers. Barrier layers deposited in contacts, vias, and other features, may also have high resistivities. Further, thin barrier and tungsten nucleation films occupy a larger percentage of smaller features, increasing the overall resistance in the feature. Resistivity of a tungsten film depends on the thickness of the film deposited, such that resistivity increases as thickness decreases due to boundary effects.

Another challenge is reducing stress on deposited films. Thinner tungsten films tend to have increased tensile stress. Conventional techniques for depositing bulk tungsten films by chemical vapor deposition have a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in nonuniform processing or inability to process the substrate. Although there are existing methods for reducing stress in films of other materials such as annealing, tungsten does not have the surface mobility to allow grains to be moved or altered once it is deposited due to its high melting point.

Fluorine-free tungsten (FFW) precursors are useful to prevent such reliability and integration issues or device performance issues. Current FFW precursors include metal organic precursors, but undesirable traces of elements from the metal organic precursors may be incorporated in the tungsten film as well, such as carbon, hydrogen, nitrogen, and oxygen. Some metal organic fluorine-free precursors are also not easily implemented or integrated in tungsten deposition processes.

Provided herein are methods of depositing fluorine-free tungsten films having using a sequential CVD process using a chlorine-containing tungsten precursor, or tungsten chloride ($WCl_x$). Tungsten chloride includes tungsten pentachloride ($WCl_5$), tungsten hexachloride ($WCl_6$), tungsten tetrachloride ($WCl_4$), tungsten dichloride ($WCl_2$), and mixtures thereof. Although examples herein refer to $WCl_5$ and $WCl_6$ as examples, it is understood that other tungsten chlorides may be used with disclosed embodiments. Films deposited using certain disclosed embodiments are fluorine-free. Certain disclosed embodiments are directed to depositing bulk tungsten using alternating pulses of a chlorine-containing tungsten precursor and hydrogen.

Figure 7:
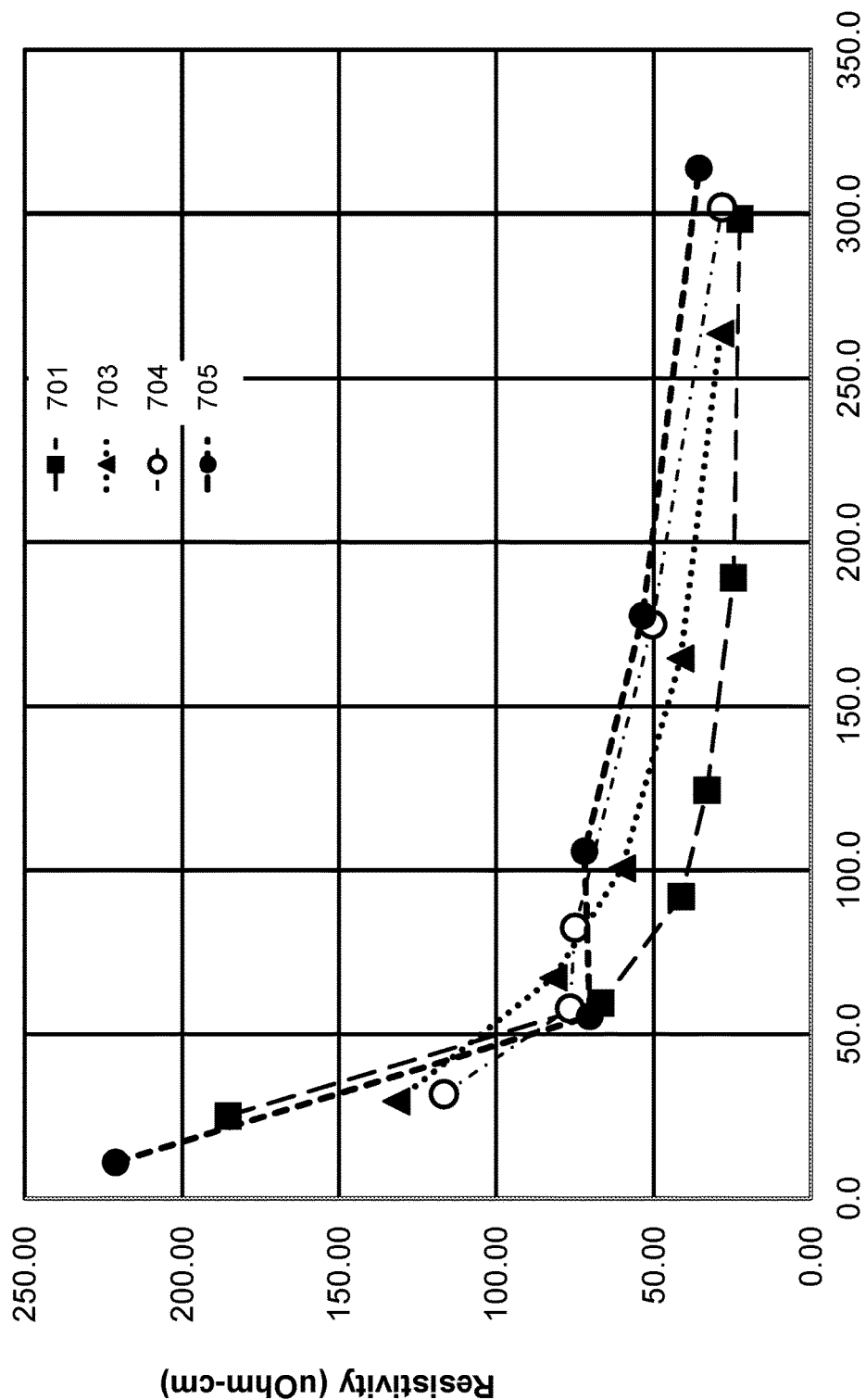
FIG. 7 is a graph of experimental results showing resistivity as a function of thickness of a tungsten film.

Alternatively, while certain disclosed embodiments described herein are directed to deposition of bulk tungsten films, in some embodiments, certain disclosed embodiments may be used to deposit tungsten films having a thickness of less than about 50 Å, which can exhibit low resistivity as shown in FIG. 7 and described in further detail below. Certain disclosed embodiments deposit thin tungsten films having substantially lower resistivity than tungsten films deposited to the same thickness using fluorine-containing tungsten precursors. In various embodiments, tungsten films deposited to a thickness less than about 50 Å using alternating pulses of a chlorine-containing tungsten precursor and hydrogen exhibits a resistivity of less than about 150 $\mu\Omega$-cm as shown in FIG. 7. In some embodiments, films deposited to a thickness less than 50 Å may be used to fill features having a small feature opening, such as a feature opening between about 25 Å and about 30 Å. In some embodiments, fluorine-free tungsten deposited using certain disclosed embodiments may be integrated with other tungsten film deposition processes.

Deposition by $WCl_5$ and $WCl_6$ presents challenges that are not present with $WF_6$, due to the latter compound's greater reactivity and tungsten chloride's possible etching character. Evaporated $WCl_6$ has a high enough vapor pressure to enable carrying it into the tungsten deposition chamber. However, $WCl_6$ may be more likely to etch the substrate than $WCl_5$. While $WCl_5$ is less likely to etch the substrate, $WCl_5$ also has a higher vapor pressure than $WCl_6$. Although the lower vapor pressure is useful in depositing tungsten films having low resistivity, some deposition may have poor step coverage. Tungsten chlorides are less reactive, and as a result, deposition is performed at higher temperature than deposition using $WF_6$. In certain disclosed embodiments, low amounts of a chlorine-containing tungsten precursor are used during a pulse of the chlorine-containing tungsten precursor to prevent etching. For example, in some embodiments, during a pulse of a chlorine-containing tungsten precursor, the amount of chlorine-containing tungsten precursor may be between about 0.1% and about 1.5% of the volume of the mixture of gases flowed during the pulse.

Disclosed embodiments may be integrated with other tungsten deposition processes to deposit a tungsten film having substantially lower resistivity than films deposited by conventional CVD. Additionally, as chlorine-containing tungsten precursors are used to deposit tungsten, deposited films are fluorine-free. In some embodiments, a soak treatment using a reducing agent such as a borane, silane, or germane may be used prior to exposing a substrate to alternating pulses of a chlorine-containing tungsten precursor and hydrogen. Another example may include depositing tungsten using a combination of alternating pulses of a chlorine-containing tungsten precursor and hydrogen with any one or more of the following: tungsten deposition by CVD using a chlorine-containing tungsten precursor, tungsten deposition by CVD using a metal organic tungsten precursor, tungsten nucleation deposition using a chlorine-containing tungsten precursor, tungsten nucleation deposition using a tungsten precursor such as $WF_6$, and tungsten deposition by CVD using a tungsten precursor such as $WF_6$. Disclosed embodiments have a wide variety of applications. Methods may be used to deposit tungsten into features with high step coverage, and may also be used to deposit tungsten into 3D NAND and vertical NAND structures, including those with deep trenches.

Methods described herein involve introducing hydrogen and a chlorine-containing tungsten precursor in alternating pulses to deposit tungsten in a feature without depositing a tungsten nucleation layer. Methods described herein introducing hydrogen and a chlorine-containing tungsten precursor in alternating pulses to deposit bulk tungsten in a feature having an untreated surface. In some embodiments, methods involve introducing hydrogen and a chlorine-containing tungsten precursor in alternating pulses to deposit bulk tungsten in an untreated feature without depositing a tungsten nucleation layer. An untreated surface is a surface of a substrate and/or feature that is not exposed to a soak treatment or not exposed to a pre-treatment prior to depositing bulk tungsten. For example, tungsten is deposited directly onto a substrate having an untreated barrier layer (such as titanium nitride) by exposing the substrate to alternating pulses of hydrogen and tungsten hexachloride.

Alternating pulses of hydrogen and a chlorine-containing tungsten precursor as described herein may be performed by introducing temporally separated pulses sequentially in cycles. Such temporally separated pulses made sequentially in cycles may be referred to herein as "sequential CVD." It will be understood that in some embodiments, not all reactants in a dose react with the reactants provided in another dose, as further described below. Alternating pulses of hydrogen and a chlorine-containing tungsten precursor as described herein may be performed by atomic layer deposition (ALD).

Unlike conventional deposition of tungsten whereby pulsing and/or simultaneous exposure of $WF_6$ and $H_2$ has little to no growth on a substrate surface, it is unexpected that chlorine-containing tungsten precursors exhibit growth on a substrate surface when reacted with $H_2$ without any nucleation layer or treatment of the surface prior to deposition of tungsten. This is particularly significant in that in conventional deposition, in order to deposit tungsten without depositing a nucleation layer, the substrate surface is pre-treated using a soak or treatment process. Additionally, in order to deposit tungsten conventionally using hydrogen and a fluorine-containing tungsten precursor, a nucleation layer is first deposited on the surface using a boron-containing or silicon-containing reducing agent and $WF_6$ before the surface is able to grow tungsten using exposure to $WF_6$ and $H_2$.

Sequential CVD processes are distinguished from non-sequential CVD, pulsed CVD, atomic layer deposition (ALD), and nucleation layer deposition. Non-sequential CVD processes involve simultaneous exposure of two reactants, such that both reactants are flowed at the same time during deposition. For example, tungsten may be deposited by exposing a substrate to hydrogen ($H_2$) and tungsten hexachloride ($WCl_6$) at the same time for a duration sufficient to fill features. Hydrogen and $WF_6$ react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten.

In contrast, sequential CVD processes implement separate exposures to each reactant such that the reactants are not flowed into the chamber at the same time during deposition. Rather, each reactant flow is introduced to a chamber housing the substrate in temporally separated pulses in sequence, repeated one or more times in cycles. Generally a cycle is the minimum set of operations used to perform a surface deposition reaction one time. The result of one cycle is the production of at least a partial film layer on a substrate surface. Cycles of sequential CVD are described in further detail below.

ALD and nucleation layer deposition also involve exposing the substrate to two reactants in temporally separated pulses in cycles. For example, in an ALD cycle, a first reactant is flowed into a chamber, the chamber is purged, a second reactant is flowed into the chamber, and the chamber is again purged. Such cycles are typically repeated to build film thickness. In conventional ALD and nucleation layer deposition cycles, the first reactant flow constitutes a first "dose" in a self-limiting reaction. For example, a substrate includes a limited number of active sites whereby a first reactant is adsorbed onto the active sites on the substrate and saturates the surface, and a second reactant reacts with the adsorbed layer to deposit material layer by layer in cycles. However, in sequential CVD, reactants do not necessarily adsorb onto active sites on the substrate and in some embodiments, the reaction may not be self-limiting. For example, reactants used in sequential CVD may have a low adsorption rate. Moreover, reactants on the surface of the substrate may not necessarily react with a second reactant when the second reactant is introduced. Rather, in some embodiments of sequential CVD, some reactants on the substrate remain unreacted during the cycle, and are not reacted until a subsequent cycle. Some reactants may not react due to stoichiometric properties, steric hindrance, or other effects. It will be understood that any of the processes described herein may be applicable to techniques involving ALD. Embodiments described herein may involve sequential CVD, ALD, or both.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have features such as via or contact holes, which may be characterized by one or more of narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, at least about 25:1, or higher. One example of a feature is a hole or via in a semiconductor substrate or a layer on the substrate FIGS. 1B-1H are schematic examples of various structures in which tungsten may be deposited in accordance with disclosed embodiments. FIG. 1B shows an example of a cross-sectional depiction of a vertical feature 101 to be filled with tungsten. The feature can include a feature hole 105 in a substrate 103. The hole 105 or other feature may have a dimension near the opening, e.g., an opening diameter or line width of between about 10 nm to 500 nm, for example between about 25 nm and about 300 nm. The feature hole 105 can be referred to as an unfilled feature or simply a feature. The feature 101, and any feature, may be characterized in part by an axis 118 that extends through the length of the feature, with vertically-oriented features having vertical axes and horizontally-oriented features having horizontal axes.

In some embodiments, features are trenches in a 3D NAND structure. For example, a substrate may include a wordline structure having at least 60 lines, with between 18 to 48 layers, with trenches at least 200 Å deep. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 1C shows an example of a feature 101 that has a re-entrant profile. A re-entrant profile is a profile that narrows from a bottom, closed end, or interior of the feature to the feature opening. According to various implementations, the profile may narrow gradually and/or include an overhang at the feature opening. FIG. 1C shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of titanium, titanium nitride, tungsten nitride, titanium aluminide, and tungsten. In some embodiments, the under-layer is tungsten-free. The under-layer 113 forms an overhang 115 such that the under-layer 113 is thicker near the opening of the feature 101 than inside the feature 101.

Figure 1E:
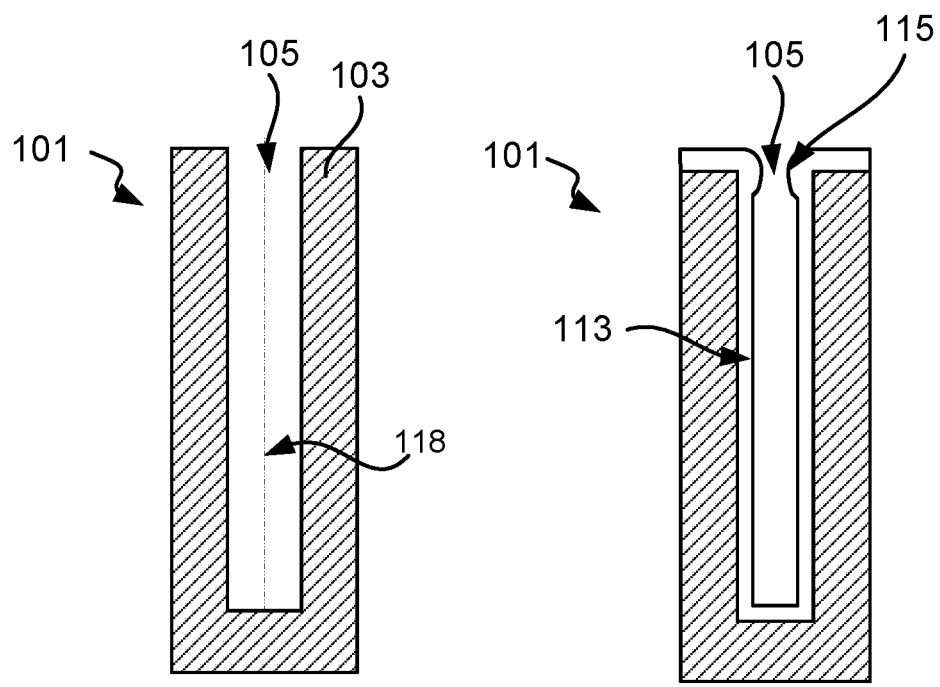
Figure 1E:
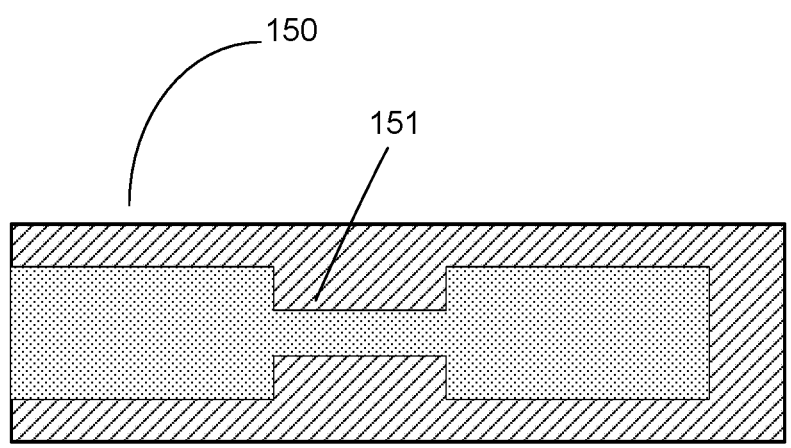
Figure 1D:
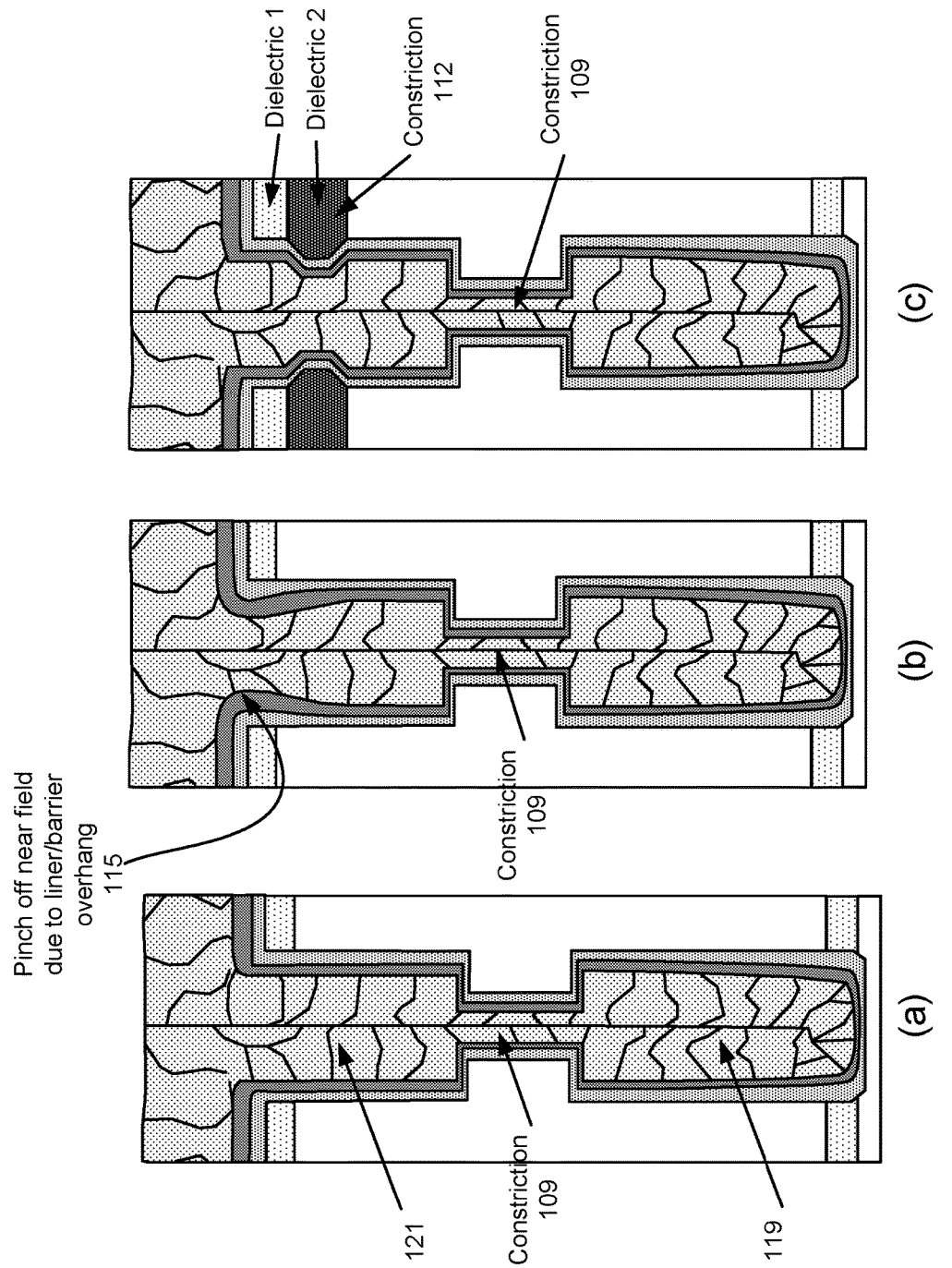

In some implementations, features having one or more constrictions within the feature may be filled. FIG. 1D shows examples of views of various filled features having constrictions. Each of the examples (a), (b) and (c) in FIG. 1D includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b).

Horizontal features, such as in 3-D memory structures, can also be filled. FIG. 1E shows an example of a horizontal feature 150 that includes a constriction 151. For example, horizontal feature 150 may be a word line in a VNAND structure.

Figure 1F:
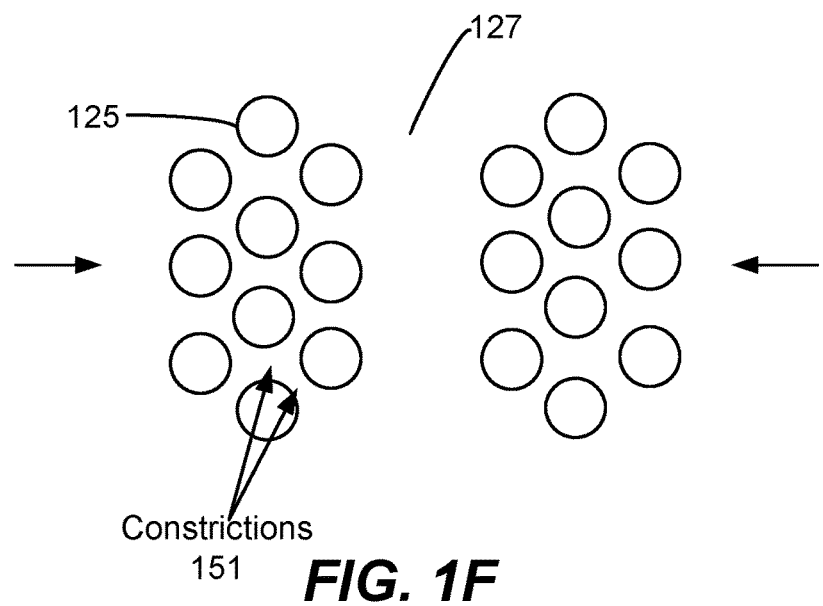
Figure 1G:
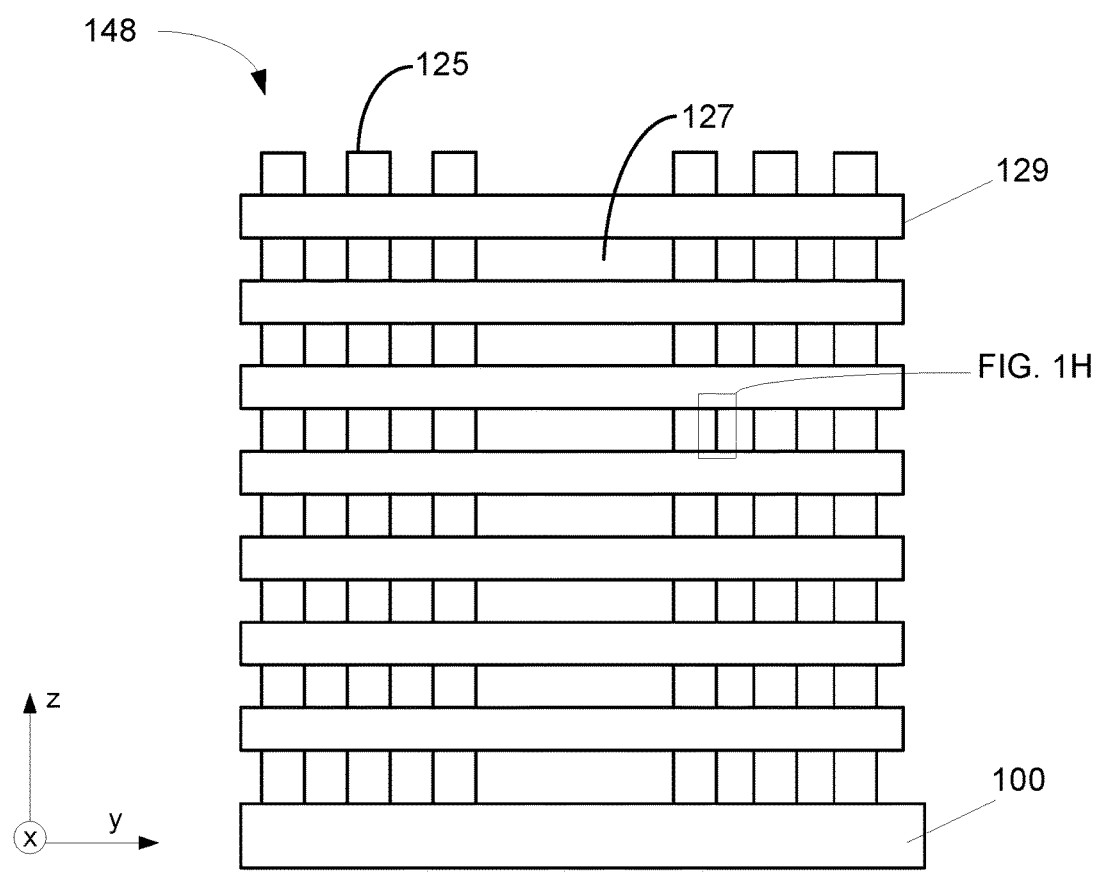

In some implementations, the constrictions can be due to the presence of pillars in a VNAND or other structure. FIG. 1F, for example, shows a plan view of pillars 125 in a VNAND or vertically integrated memory (VIM) structure 148, with FIG. 1G showing a simplified schematic of a cross-sectional depiction of the pillars 125. Arrows in FIG. 1F represent deposition material; as pillars 125 are disposed between an area 127 and a gas inlet or other deposition source, adjacent pillars can result in constrictions 151 that present challenges in void free fill of an area 127.

The structure 148 can be formed, for example, by depositing a stack of alternating interlayer dielectric layers 129 and sacrificial layers (not shown) on a substrate 100 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 125, which can include channel regions of the completed memory device.

The main surface of substrate 100 can extend in the x and y directions, with pillars 125 oriented in the z-direction. In the example of FIGS. 1F and 1G, pillars 125 are arranged in an offset fashion, such that pillars 125 that are immediately adjacent in the x-direction are offset with each other in the y-direction and vice versa. According to various implementations, the pillars (and corresponding constrictions formed by adjacent pillars) may be arranged in any number of manners. Moreover, the pillars 125 may be any shape including circular, square, etc. Pillars 125 can include an annular semi-conducting material, or circular (or square) semi-conducting material. A gate dielectric may surround the semi-conducting material. The area between each interlayer dielectric layer 129 can be filled with tungsten; thus structure 148 has a plurality of stacked horizontally-oriented features that extend in the x and/or y directions to be filled.

Figure 1H:
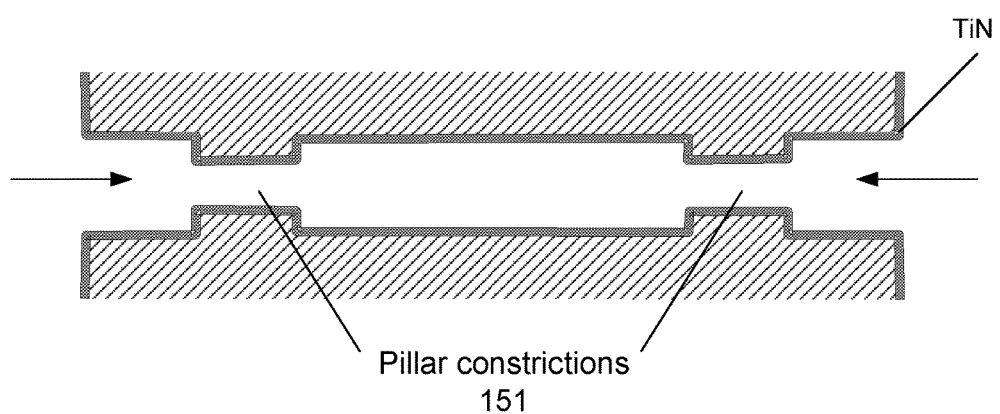

FIG. 1H provides another example of a view of a horizontal feature, for example, of a VNAND or other structure including pillar constrictions 151. The example in FIG. 1H is open-ended, with material to be deposited able to enter horizontally from two sides as indicated by the arrows. (It should be noted that example in FIG. 1H can be seen as a 2-D rendering 3-D features of the structure, with the FIG. 1H being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 1G), and can present more challenges for fill than filling holes or trenches that extend along one or two dimensions. For example, controlling fill of a 3-D structure can be challenging as deposition gasses may enter a feature from multiple dimensions.

Examples of feature fill for horizontally-oriented and vertically-oriented features are described below. It should be noted that in most cases, the examples applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium aluminide (TiAl)), tantalum-containing materials (e.g., tantalum (Ta), and tantalum nitride (TaN)), and nickel-containing materials (e.g., nickel (Ni) and nickel silicide (NiSi). Further, the methods and apparatus disclosed herein are not limited to feature fill, but can be used to deposit tungsten on any appropriate surface including forming blanket films on planar surfaces.

Figure 2A:
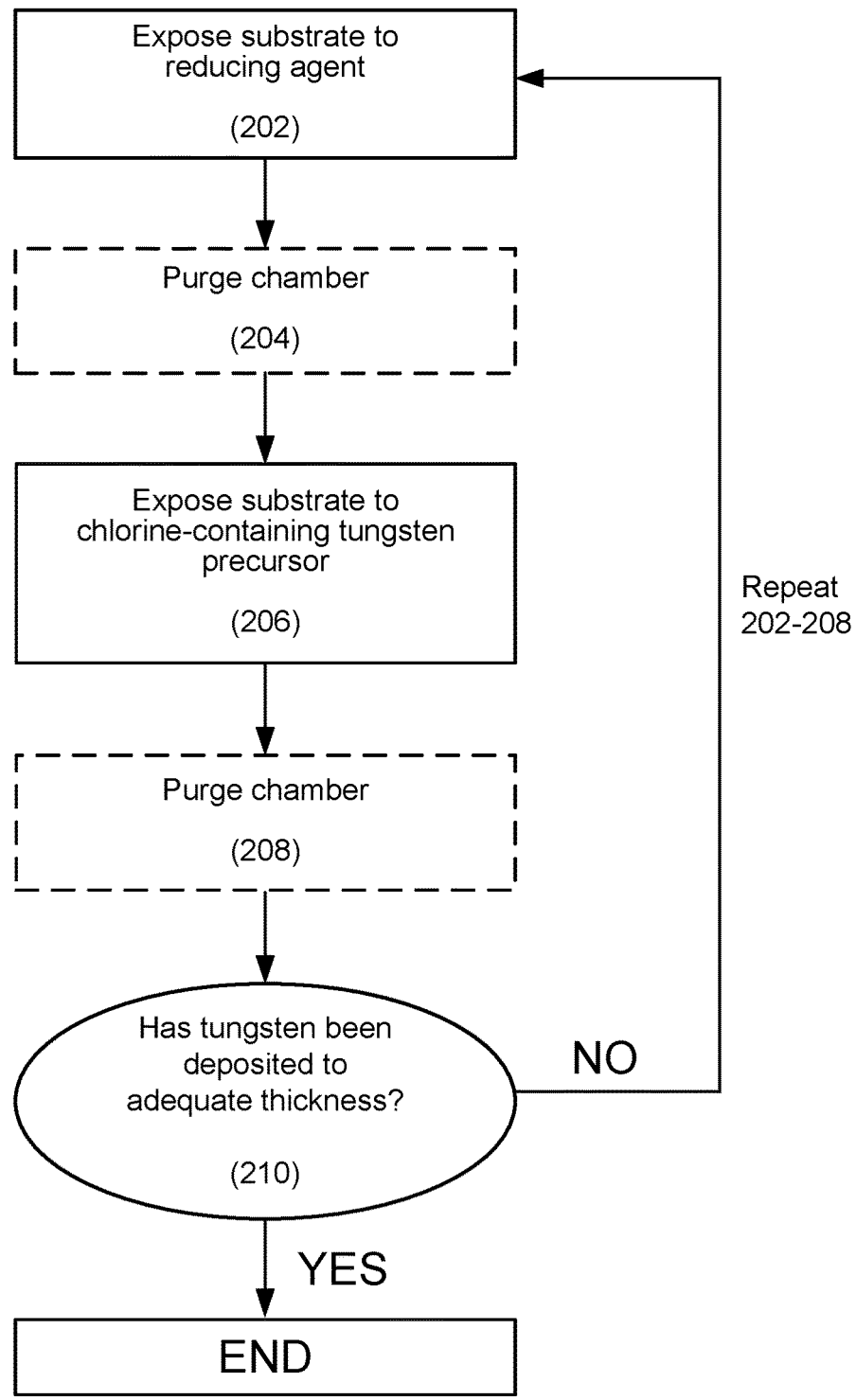
FIG. 2A is a process flow diagram depicting operations for methods in accordance with certain disclosed embodiments.

FIG. 2A provides a process flow diagram for a method performed in accordance with disclosed embodiments. Operations 202-210 of FIG. 2A are performed to deposit a tungsten layer by sequential CVD directly onto a substrate without depositing a tungsten nucleation layer. Prior to operation 202, a substrate having no tungsten nucleation layer deposited thereon is provided. It will be understood that certain disclosed embodiments for depositing bulk tungsten may begin a cycle of deposition with either exposure to a reducing agent dose (operation 202) or may begin with a chlorine-containing tungsten precursor dose (operation 206). Certain disclosed embodiments may be performed at a substrate temperature between about 400° C. and about 600° C., such as about 525° C. It will be understood that substrate temperature refers to the temperature to which the pedestal holding the substrate is set. Certain disclosed embodiments may be performed at a chamber pressure between about 3 Torr and about 60 Torr. In some embodiments, chamber pressure is less than about 10 Torr. For example, in some embodiments chamber pressure is about 5 Torr.

In operation 202, the substrate is exposed to a reducing agent, such as hydrogen ($H_2$). This operation may be referred to as a "pulse" or a "dose," which may be used interchangeably herein. In embodiments described herein, $H_2$ is provided as an example reducing agent, but it will be understood that other reducing agents, including silanes, boranes, germanes, phosphines, hydrogen-containing gases, and combinations thereof, may be used. In various embodiments, bulk tungsten deposition is performed using hydrogen as a reducing agent. Unlike non-sequential CVD, $H_2$ is pulsed without flowing another reactant. In some embodiments, a carrier gas may be flowed. In some embodiments, a carrier gas, such as nitrogen ($N_2$), argon (Ar), helium (He), or other inert gases, may be flowed during operation 202.

Operation 202 may be performed for any suitable duration. In some examples, Example durations include between about 0.25 seconds and about 30 seconds, about 0.25 seconds and about 20 seconds, about 0.25 seconds and about 5 seconds, or about 0.5 seconds and about 3 seconds.

In operation 204, the chamber is optionally purged to remove excess hydrogen that did not adsorb to the surface of the substrate. A purge may be conducted by flowing an inert gas at a fixed pressure thereby reducing the pressure of the chamber and re-pressurizing the chamber before initiating another gas exposure. Example inert gases include nitrogen ($N_2$), argon (Ar), helium (He), and mixtures thereof. The purge may be performed for a duration between about 0.25 seconds and about 30 seconds, about 0.25 seconds and about 20 seconds, about 0.25 seconds and about 5 seconds, or about 0.5 seconds and about 3 seconds.

In operation 206, the substrate is exposed to a chlorine-containing tungsten precursor. Example chlorine-containing tungsten precursors have a chemical formula of $WCl_x$, where x is an integer between and including 2 and 6, such as 2, 3, 4, 5, or 6. Examples include $WCl_5$ and $WCl_6$. The chlorine-containing tungsten precursor may include a mixture of $WCl_x$ compounds. In some embodiments, a carrier gas, such as nitrogen ($N_2$), argon (Ar), helium (He), or other inert gases, may be flowed during operation 206. In various embodiments, during operation 206, the amount of chlorine-containing tungsten precursor by volume may be between about 0.1% and about 1.5%.

Operation 206 may be performed for any suitable duration and at any suitable temperature. In some examples, operation 206 may be performed for a duration between about 0.25 seconds and about 30 seconds, about 0.25 seconds and about 20 seconds, about 0.25 seconds and about 5 seconds, or about 0.5 seconds and about 3 seconds. This operation may be performed in some embodiments for a duration sufficient to saturate the active sites on the surface of the substrate. In some embodiments, $WCl_x$ may be diverted to fill the gas line and line change before dosing. The carrier gas may be any of those described above with respect to operation 202.

During operation 206, some $WCl_x$ may react with $H_2$ that remained on the surface from the prior dose. During operation 206, some $WCl_x$ may not fully react with $H_2$ that remained on the surface from the prior dose. Examples are further described below with respect to FIGS. 3D and 3E.

During operation 206 of FIG. 2A, some $H_2$ may not react with $WCl_x$ at all and $WCl_x$ may instead be physisorbed onto the surface of the substrate where no $H_2$ physisorbed or remained on the substrate surface. In some embodiments, $H_2$ may remain on the substrate surface but may not be physisorbed or chemisorbed to the surface.

Operation 206 of FIG. 2A may thereby form a sub-monolayer of tungsten in many embodiments. For example, a sub-monolayer having a thickness of about 0.3 Å may be deposited after performing operations 202-206.

In operation 208, there may be an optional purge operation to purge excess chlorine-containing tungsten precursor still in gas phase that did not react with hydrogen on the surface of the feature. A purge may be conducted by flowing an inert gas at a fixed pressure thereby reducing the pressure of the chamber and re-pressurizing the chamber before initiating another gas exposure.

The chamber may be purged for any suitable duration. The chamber may be purged for a duration between about 0.25 seconds and about 30 seconds, about 0.25 seconds and about 20 seconds, about 0.25 seconds and about 5 seconds, or about 0.5 seconds and about 3 seconds. In some embodiments, the purge duration is between about 0.1 seconds and about 2 seconds and may prevent removing all of the $WCl_x$ from the substrate surface due to the low adsorption rate of $WCl_x$ to a surface of tungsten. In some embodiments, purge duration is between about 0.1 seconds and about 15 seconds, such as about 7 seconds. For example, for fabrication of a 3D NAND structure, the chamber may be purged for about 7 seconds during operation 288. The purge duration depends on the substrate and stress. The purge gas may be any of the gases described above with respect to operation 204.

In operation 210, it is determined whether the tungsten layer has been deposited to an adequate thickness. If not, operations 202-208 are repeated until a desired thickness of a tungsten layer is deposited on the surface of the feature. Each repetition of operations 202-208 may be referred to as a "cycle." In some embodiments, the order of operations 202 and 206 may be reversed, such that a chlorine-containing tungsten precursor is introduced first.

Figure 2B:
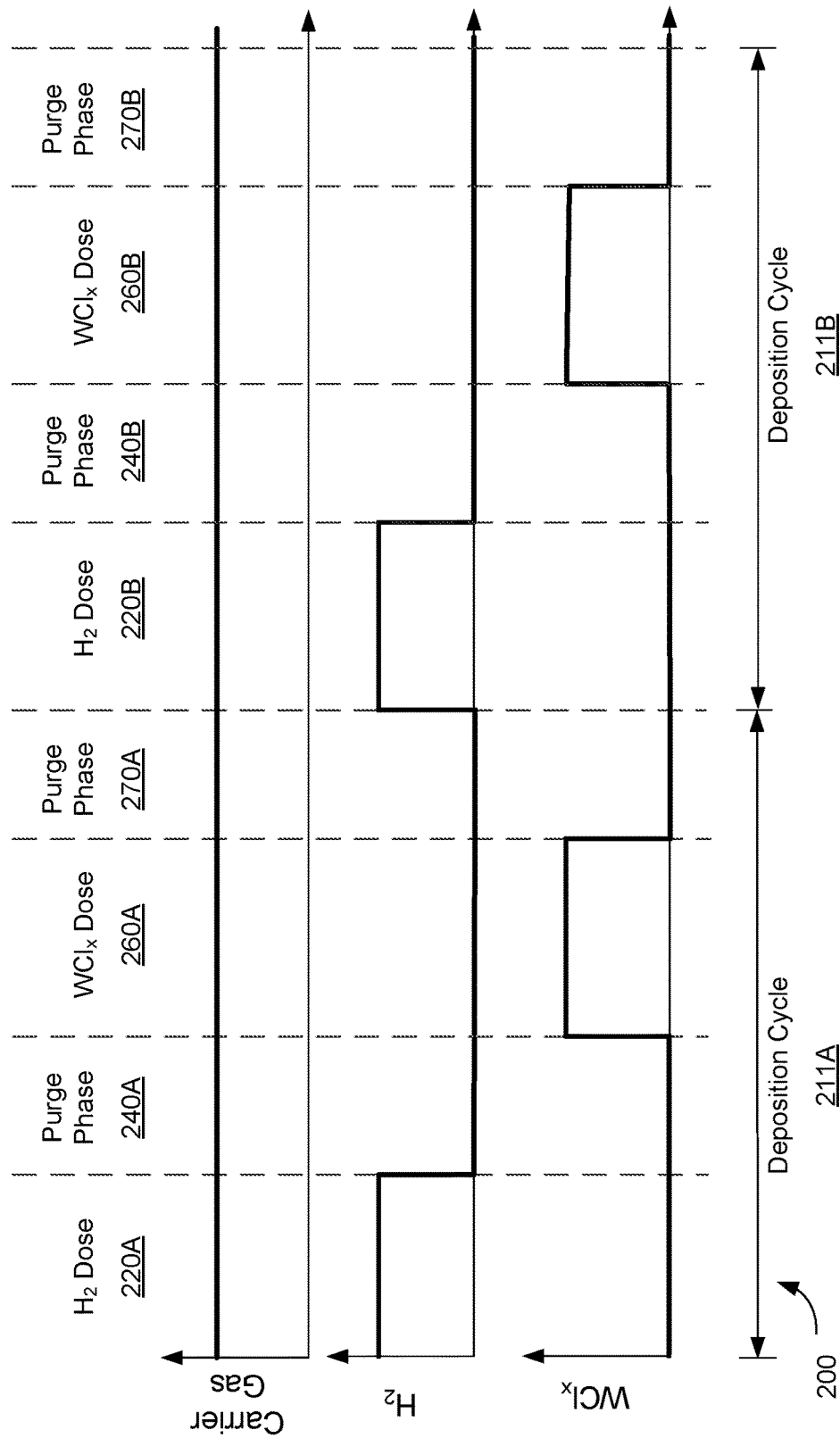
FIG. 2B is a timing sequence diagram showing example cycles in a method for depositing films in accordance with certain disclosed embodiments.

FIG. 2B provides a timing sequence diagram depicting examples cycles of sequential CVD in a process for depositing tungsten. Note that in the example provided in FIG. 2B, the hydrogen dose is performed prior to dosing $WCl_x$. Note that as shown in FIG. 2A, the reducing agent pulse may be performed prior to exposure to a chlorine-containing tungsten precursor in some embodiments. It will be understood that in some embodiments, the chlorine-containing tungsten precursor exposure may be performed prior to a reducing agent pulse.

FIG. 2B shows $H_2$ dose 220A in deposition cycle 211A which may correspond with operation 202 of FIG. 2A. During a $H_2$ dose 220A, a carrier gas is flowed, the reducing agent is pulsed, and $WCl_x$ flow is turned off. Operation 204 of FIG. 2A may correspond to purge phase 240A of FIG. 2B. As shown in FIG. 2B, during purge phase 240A, the carrier gas is flowed but $H_2$ flow and $WCl_x$ flow are turned off. Operation 206 of FIG. 2A may correspond to $WCl_x$ dose 260A in FIG. 2B. As shown in FIG. 2B, during the $WCl_x$ dose 260A, the carrier gas is flowed, the $H_2$ flow is turned off, and the $WCl_x$ flow is turned on. Operation 208 of FIG. 2A may correspond to purge phase 270A of FIG. 2B. As shown in FIG. 2B, purge phase 270A concludes deposition cycle 211A.

In FIG. 2B, it is determined that tungsten has not been deposited to an adequate thickness, so operations 202-208 of FIG. 2B are repeated in deposition cycle 211B, such that an $H_2$ dose 220B is performed, followed by a purge phase 240B. A $WCl_x$ dose 260B is performed, followed by another purge phase 270B.

Figure 3A:
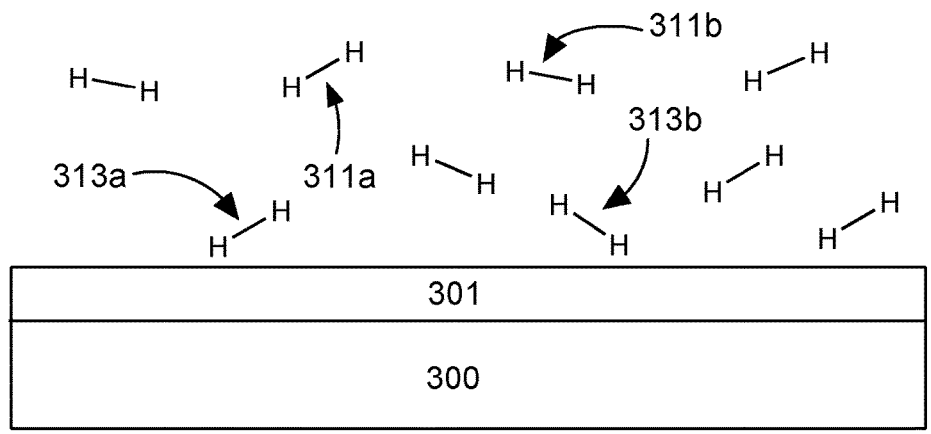
FIGS. 3A-3J are schematic diagrams of an example of a mechanism for depositing films in accordance with certain disclosed embodiments.
Figure 3B:
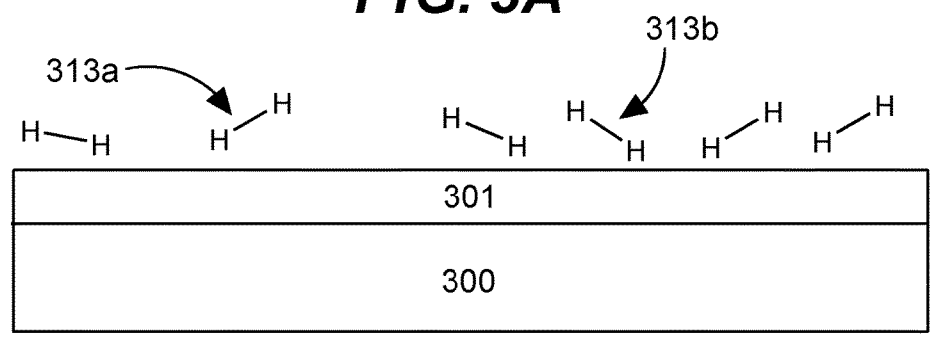
Figure 3C:
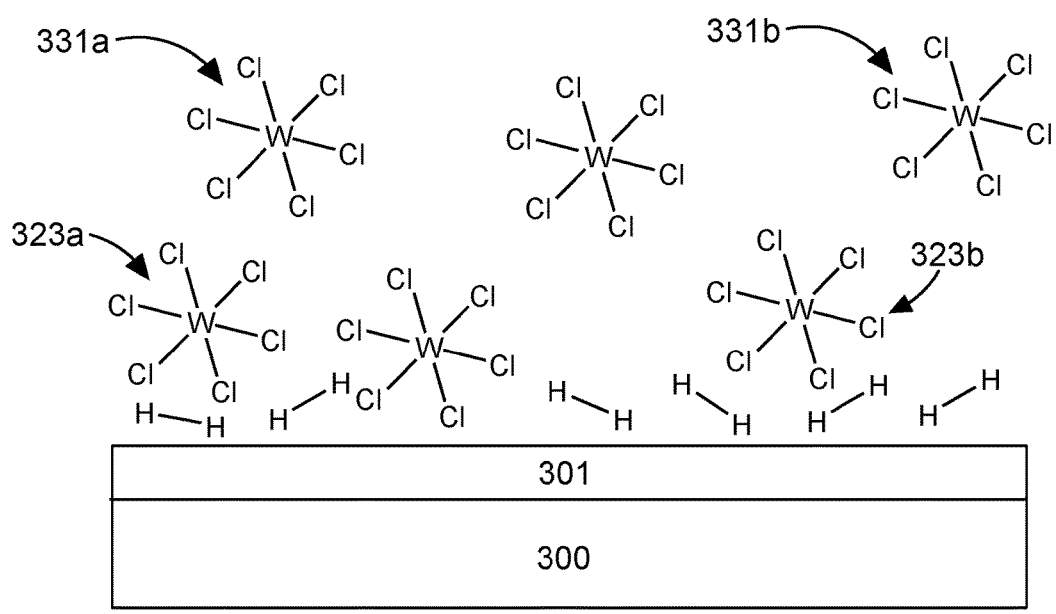
Figure 3D:
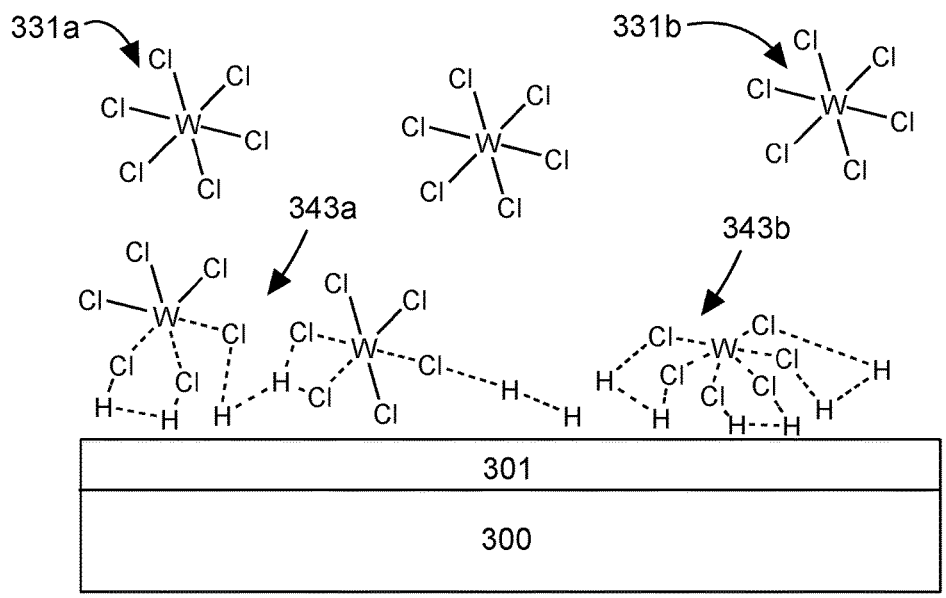
Figure 3E:
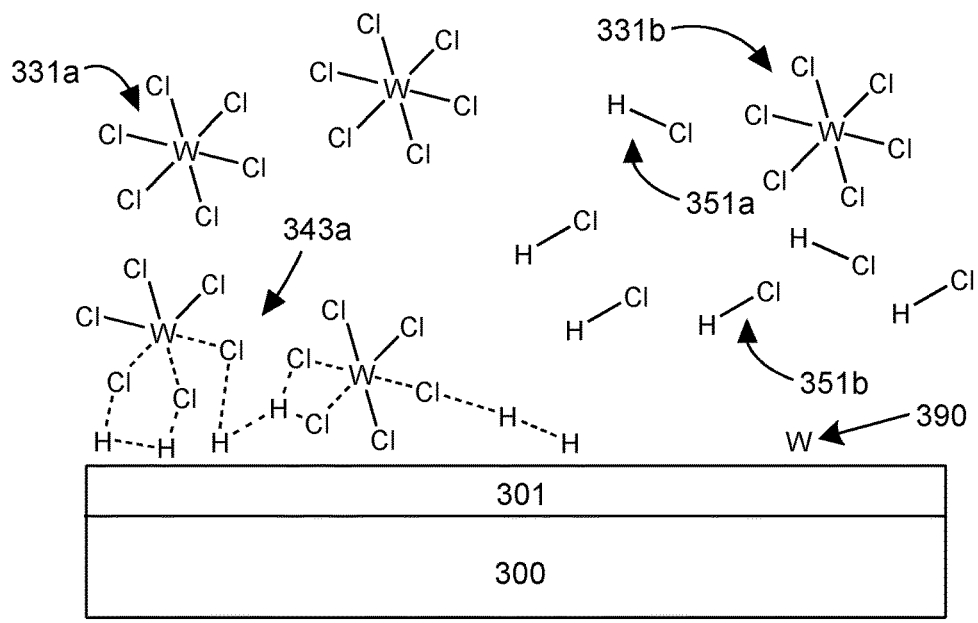

FIGS. 3A-3J are schematic illustrations of an example mechanism for cycles of sequential CVD. FIG. 3A depicts an example mechanism where $H_2$ is introduced to the substrate 300, which has an underlayer 301 deposited thereon. Underlayer 301 may be a barrier layer in some embodiments. For example, in some embodiments, underlayer 301 is a titanium nitride layer. Note that the substrate 300 does not include a tungsten nucleation layer. Hydrogen is introduced in gas phase (311a and 311b) and some $H_2$ (313a and 313b) is on the surface of the underlayer 301, but may not necessarily adsorb onto the surface. For example, H₂ may not necessarily chemisorb onto the underlayer 301, but in some embodiments, may physisorb onto the surface of the underlayer 301.

FIG. 3B shows an example illustration whereby H₂ previously in gas phase (311a and 311b in FIG. 3A) are purged from the chamber, and H₂ previously on the surface (313a and 313b) remain on the surface of the underlayer 301.

FIG. 3C shows an example schematic illustration whereby the substrate is exposed to $WCl_6$, some of which is in gas phase (331a and 331b) and some of which is at or near the surface of the substrate (323a and 323b).

During operation 202, some H₂ may react with $WCl_6$ that remained on the surface from the prior dose. In FIG. 3D, $WCl_6$ may react with H₂ to temporarily form intermediate 343b, whereby in FIG. 3E, intermediate 343b fully reacts to leave tungsten 390 on the surface of the substrate 300 on the underlayer 301, and HF in gas phase (351a and 351b, for example). Note that in this example, tungsten 390 grows directly on the underlayer 301 without depositing a nucleation layer and without treating the underlayer 301 prior to depositing tungsten. It will be understood that in some embodiments, prior to exposing the underlayer 301 to hydrogen or a chlorine-containing tungsten precursor, the underlayer 301 may be exposed to a soak treatment, such as by exposing to diborane.

During operation 202, some H₂ may not fully react with $WCl_6$ that remained on the surface from the prior dose. As shown in FIG. 3D, $WCl_6$ may partially react with H₂ to form intermediate 343a, whereby in FIG. 3E, intermediate 343a remains partially reacted on the surface of the substrate 300 on the underlayer 301. The reaction mechanism involving $WCl_6$ and H₂ may be slower than a reaction between a borane or a silane or a germane with $WCl_6$ for deposition of a tungsten layer due to activation energy barriers and steric effects. In various embodiments, the film deposited using a chlorine-containing tungsten precursor and hydrogen has a lower resistivity than a film deposited using a borane, silane, or germane, for deposition thicknesses up to about 50 Å. For example, without being bound by a particular theory, the stoichiometry of $WCl_6$ may use at least three H₂ molecules to react with one molecule of $WCl_6$. It is possible that $WCl_6$ partially reacts with molecules of H₂ but rather than forming tungsten, an intermediate is formed. For example, this may occur if there is not enough H₂ in its vicinity to react with $WCl_6$ based on stoichiometric principles (e.g., three H₂ molecules are used to react with one molecule of $WCl_6$) thereby leaving an intermediate 343a on the surface of the substrate.

Figure 3F:
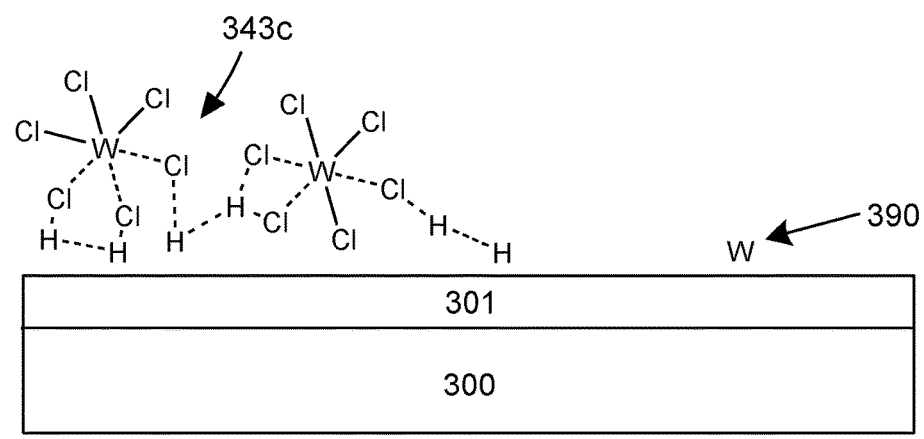

FIG. 3F provides an example schematic of the substrate when the chamber is purged. This may correspond to operation 204 of FIG. 2A. Note that compound 343c of FIG. 3F may be an intermediate formed but not completely reacted, while some tungsten 390 may be formed on the substrate. Each cycle thereby forms a sub-monolayer of tungsten on the substrate.

Figure 3G:
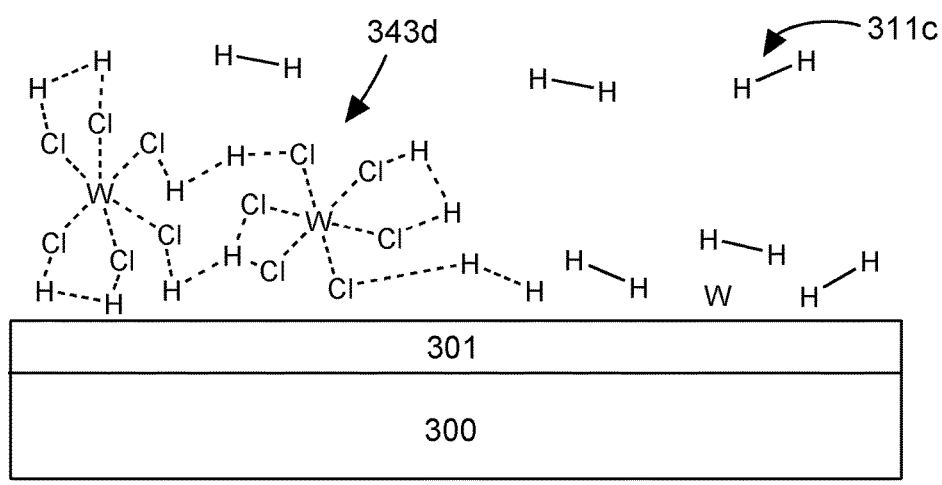
Figure 3H:
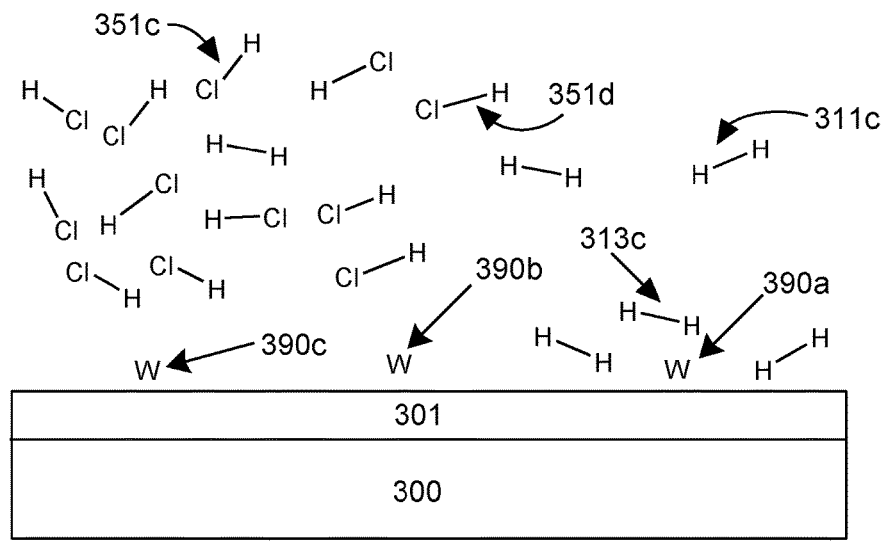

As an example, FIG. 3G shows an illustration when a cycle is repeated, whereby H₂ 311c in gas phase is introduced to the substrate with the deposited tungsten 390 and the partially reacted intermediate 343d thereon. This may correspond to operation 202 of FIG. 2A in a repeated cycle after determining in operation 210 that tungsten has not been deposited to an adequate thickness. Note that as shown in FIG. 3G, the H₂ introduced may now fully react with the intermediate 343d on the substrate such that, as shown in FIG. 3H, the reacted compound 343d leaves behind deposited tungsten 390b and 390c, and byproducts HCl 351c and 351d are formed in gas phase. Some H₂ 311c may remain in gas phase, while some H₂ 313c may remain on the tungsten layer 390a.

Figure 3I:
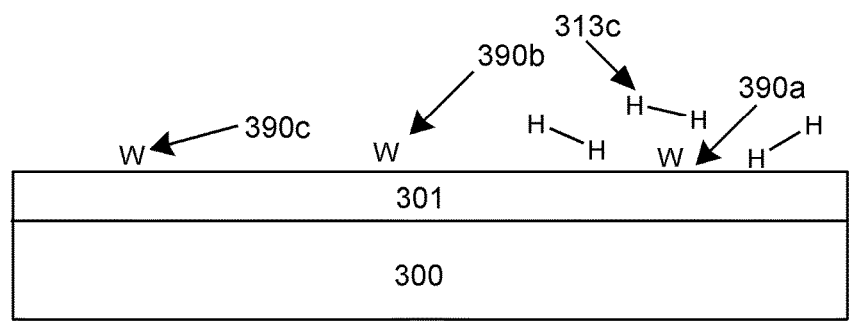
Figure 3J:
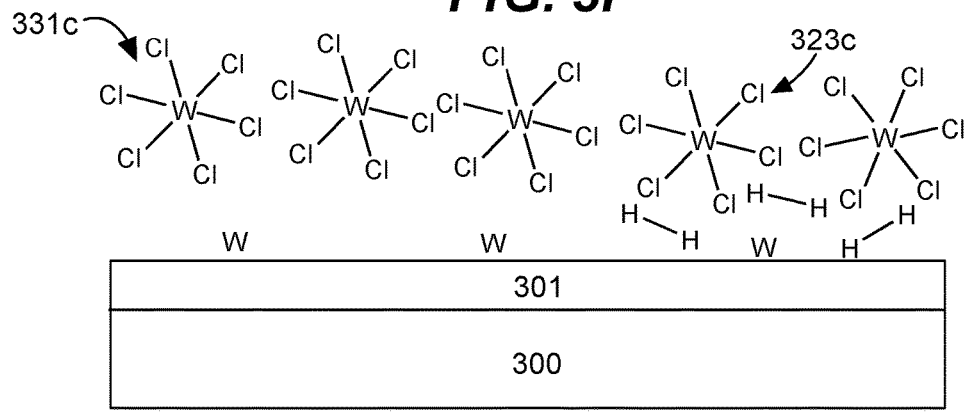

In FIG. 3I, the chamber is purged (thereby corresponding with operation 204 of FIG. 2A, or operation 240B of FIG. 2B), leaving behind deposited tungsten 390a, 390b, and 390c, and some H₂ 313c. In FIG. 3J, $WCl_6$ is again introduced in a dose such that molecules 331c and 323c may then adsorb and/or react with H₂ and the substrate. FIG. 3J may correspond to operation 206 of FIG. 2A or 260B of FIG. 2B. After the $WCl_6$ dose, the chamber may again be purged and cycles may be repeated again until the desired thickness of tungsten is deposited.

Tungsten films deposited using certain disclosed embodiments have no fluorine content, as compared to tungsten deposited using conventional fluorine-containing tungsten precursors. Overall tensile stress of films may be less than about 0.2 GPa.

Disclosed embodiments may have various applications in tungsten deposition processes. It will be understood that various combinations of the applications described herein may be used to deposit tungsten and methods are not limited to the examples provided herein.

For example, in some embodiments, a feature may be filled by depositing a tungsten nucleation layer by ALD cycles of alternating pulses of a reducing agent (e.g., a borane, a silane, or a germane) and $WCl_6$, followed by bulk tungsten deposition by alternating pulses of hydrogen and a chlorine-containing tungsten precursor as described above with respect to FIG. 2A.

In another example, in some embodiments, a tungsten nucleation layer may be deposited using ALD cycles of a reducing agent and $WCl_6$, followed by bulk tungsten deposition using a combination of CVD of fluorine-free tungsten using a reducing agent and a fluorine-free tungsten-containing precursor (e.g., a metal-organic tungsten precursor), and alternating pulses of hydrogen and a chlorine-containing tungsten precursor as described above with respect to FIG. 2A. Fluorine-free tungsten precursors may also include tungsten carbonyl ($W(CO)_6$), and tungsten chlorides ($WCl_x$) such as tungsten pentachloride ($WCl_5$) and tungsten hexachloride ($WCl_6$).

In another example, a tungsten nucleation layer may be deposited on a feature by ALD cycles of alternating pulses of a reducing agent and $WCl_6$, and tungsten bulk may be deposited by alternating between sequential CVD and non-sequential CVD. For example, bulk tungsten may be deposited using a number of cycles of sequential CVD using alternating pulses of hydrogen and a chlorine-containing tungsten precursor between pre-determined durations of non-sequential CVD. In a specific example, bulk tungsten may be deposited using about 5 cycles of sequential CVD, followed by 5 seconds of non-sequential CVD, followed by 5 cycles of sequential CVD, and another 5 seconds of non-sequential CVD.

In another example, a feature may be filled by first depositing a tungsten nucleation layer by ALD cycles of alternating pulses of a reducing agent and $WCl_6$, then partially filling the feature using sequential CVD, and filling the rest of the feature by non-sequential CVD.

In another example, a feature may be filled by depositing a tungsten nucleation layer by ALD cycles of alternating pulses of a reducing agent and $WCl_6$, followed by partial deposition of bulk tungsten by sequential CVD, and complete bulk fill by CVD of fluorine-free tungsten (such as using a metal-organic tungsten precursor). For example, a number of cycles of sequential CVD using a chlorine-containing tungsten precursor may be performed to partially fill a feature with bulk tungsten, followed by CVD using simultaneous exposure to a metal organic tungsten precursor and $H_2$ to fill the rest of the feature. Note in some embodiments, a feature may be filled without depositing a nucleation layer, but a nucleation layer may help reduce growth delay of bulk tungsten.

In various embodiments, a soak or surface treatment operation may be performed prior to depositing a nucleation layer. Example soak or surface treatments include exposing the substrate to silane ($SiH_4$), disilane ($Si_2H_6$), trisilane ($Si_3H_8$), germane ($GeH_4$), argon (Ar), tungsten hexafluoride ($WF_6$), diborane ($B_2H_6$), hydrogen ($H_2$), nitrogen ($N_2$) gas, or combinations thereof. In some embodiments, the substrate may be soaked using one or more gases. For example, in some embodiments, the substrate may be exposed to silane for a first duration, and then exposed to diborane for a second duration. Such operations may also be repeated in cycles. In another example, the substrate may be exposed to diborane for a first duration, and then exposed to silane for a second duration. In another example, the substrate may be exposed to diborane for a first duration, and then exposed to hydrogen for a second duration. In another example, the substrate may be exposed to silane for a first duration, and then exposed to hydrogen for a second duration. In some embodiments, the substrate may be exposed to nitrogen gas in combination with any of the above described soaking processes. In any of the disclosed embodiments, a chamber housing the substrate may be purged between one or more soak operations. Purging may be performed by flowing an inert gas such as argon into the chamber. For example, in one example, the substrate may be exposed to diborane for a first duration, the chamber may then be purged, and then the substrate may be exposed to silane for a second duration.

Bulk tungsten deposition may be deposited using any of the disclosed embodiments described herein and in some embodiments may be integrated with embodiments described in U.S. patent application Ser. No. 14/723,275 filed on May 27, 2015, which is herein incorporated by reference in its entirety. In any of the above described implementations, bulk tungsten may also be deposited periodically, with soak and/or surface treatment and/or conventional CVD deposition operations performed between bulk depositions. Bulk tungsten deposition is performed without depositing a tungsten nucleation layer. In various embodiments, bulk tungsten is deposited directly on a substrate using certain disclosed embodiments. In various embodiments, bulk tungsten is deposited directly on a substrate using certain disclosed embodiments before any tungsten is deposited on the substrate. In various embodiments, bulk tungsten is deposited directly on a substrate using certain disclosed embodiments. In various embodiments, bulk tungsten is deposited directly in a feature on a substrate using certain disclosed embodiments before any tungsten is deposited in a feature on the substrate.

In another example, in some embodiments, bulk tungsten may be deposited using disclosed embodiments as described above with respect to FIG. 2A, then bulk tungsten deposition may be paused, then the substrate may be exposed to a soak or surface treatment by flowing any of silane, disilane, trisilane, germane, diborane, hydrogen, tungsten hexafluoride, nitrogen, argon, and combinations thereof, to treat the surface of the substrate, then the bulk tungsten deposition may be resumed using disclosed embodiments as described above with respect to FIG. 2A. Bulk tungsten deposition may be performed by exposing the substrate to a tungsten-containing precursor such as $WCl_6$ and any one or more of the following gases: hydrogen, silane, disilane, trisilane, diborane, nitrogen, argon, and germane. Bulk tungsten may also be deposited using a combination of sequential CVD and conventional CVD. Conventional CVD may be performed before, during (such as by cycling between sequential and conventional CVD), or after depositing bulk tungsten using sequential CVD.

In some embodiments, the substrate may be annealed at any suitable temperature before depositing bulk tungsten and after depositing the nucleation layer. In some embodiments, the substrate may be annealed at any suitable temperature after depositing the bulk tungsten layer. In some embodiments, the substrate may be annealed at any suitable temperature during intermediate times during deposition of the bulk tungsten. Annealing may be performed in any suitable gas environment, such as an environment including one or more of the following gases: tungsten-containing gas such as $WCl_6$, hydrogen, silane, disilane, trisilane, diborane, nitrogen, argon, and germane.

In various embodiments, the chamber housing the substrate may be pumped or purged before or after doses of the tungsten-containing precursor and reducing agent for depositing bulk tungsten in accordance with disclosed embodiments as described above with respect to FIG. 2A. In some embodiments, delay time may be incorporated into a dose or purge step of sequential CVD deposition as described herein. In some embodiments, one or more gases may be co-flowed during a dose or purge operation using one or more of any of the following gases: $WCl_6$, hydrogen, silane, disilane, trisilane, diborane, nitrogen, argon, and germane.

Disclosed embodiments may be performed at any suitable pressure, such as pressures greater than about 10 Torr, or pressures less than about 10 Torr. For a multi-station chamber, each pedestal may be set at different temperatures. In some embodiments, each pedestal is set at the same temperature. Substrates may be cycled from station to station during any or all of any of the above described operations in accordance with disclosed embodiments. Chamber pressure may also be modulated in one or more operations of certain disclosed embodiments. In some embodiments, chamber pressure during nucleation deposition is different from chamber pressure during bulk deposition. In some embodiments, chamber pressure during nucleation deposition is the same as the chamber pressure during bulk deposition.

During any of the above described exposures, the gases may be pulsed or flowed continuously. For example, in some embodiments, during a $WCl_6$ dose of a sequential CVD operation, $WCl_6$ may be pulsed one or more times during a single dose. Likewise, in some embodiments, during a purge, an inert gas may be pulsed during one or more times during a single purge operation. Such pulsing operations may be performed during any operation of nucleation deposition or any operation of bulk deposition or any combination thereof. In some embodiments, one or more changes to one or more parameters such as pressure, flow rate, and temperature, may be used. In some embodiments, the pedestal may be moved during any operation of the nucleation deposition or bulk deposition or both such that the gap between the substrate and a showerhead over the pedestal may be modulated. Moving the pedestal may be used in combination with altering one or more parameters such as pressure, temperature, or flow rate. Modulating the gap between the substrate and the showerhead can affect the pressure, temperature, or flow rate that may be used in accordance with certain disclosed embodiments.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. In some embodiments, sequential chemical vapor deposition (CVD) may be performed at a first station that is one of two, five, or even more deposition stations positioned within a single deposition chamber. Thus, for example, hydrogen ($H_2$) and tungsten hexachloride ($WCl_6$) may be introduced in alternating pulses to the surface of the semiconductor substrate, at the first station, using an individual gas supply system that creates a localized atmosphere at the substrate surface. Another station may be used for fluorine-free tungsten deposition, or non-sequential CVD. Two or more stations may be used to deposit tungsten in a parallel processing. Alternatively a wafer may be indexed to have the sequential CVD operations performed over two or more stations sequentially.

Figure 4:
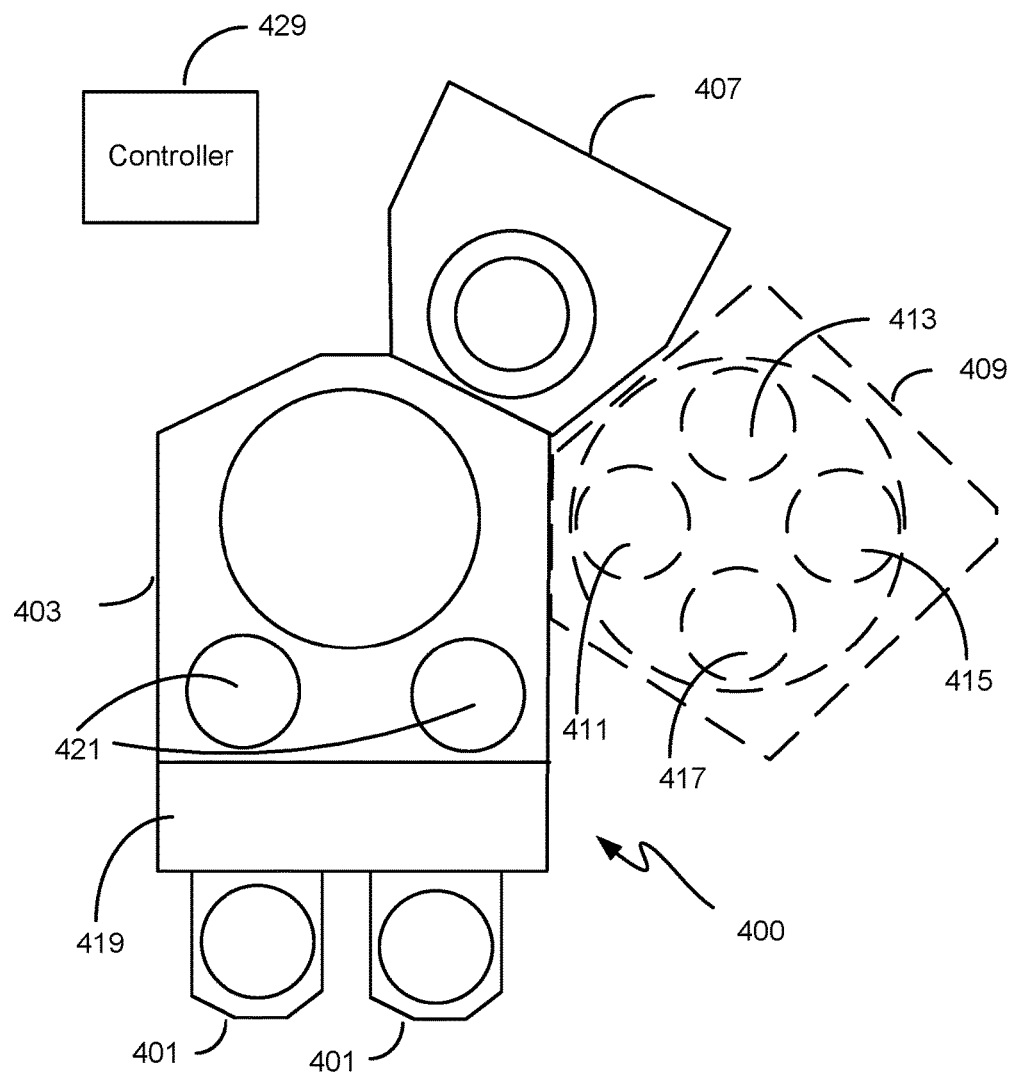
FIG. 4 is a schematic diagram of an example process tool for performing certain disclosed embodiments.
Figure 5:
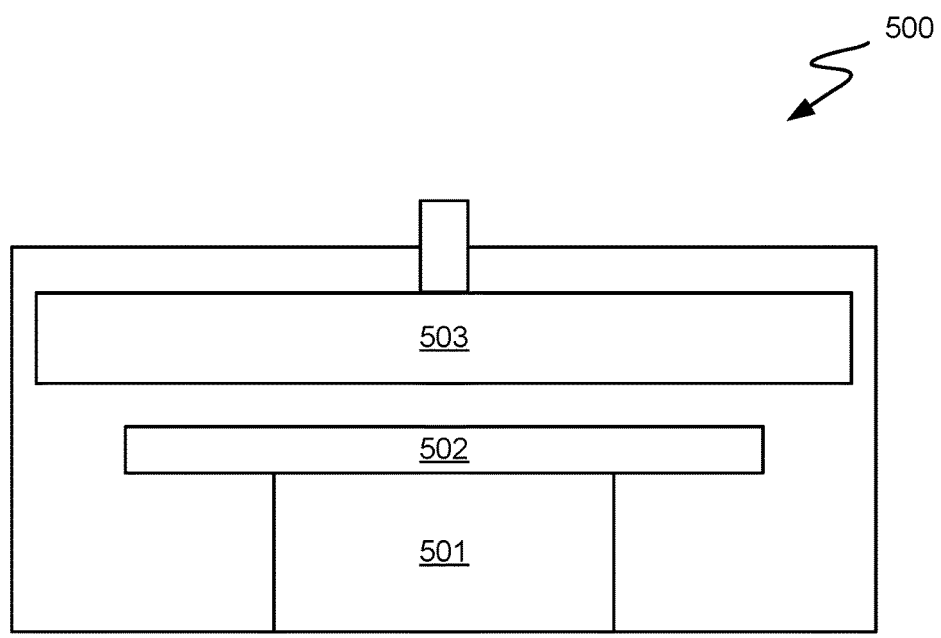
FIG. 5 is a schematic diagram of an example station for performing certain disclosed embodiments.

FIG. 4 is a block diagram of a processing system suitable for conducting tungsten thin film deposition processes in accordance with embodiments. The system 400 includes a transfer module 403. The transfer module 403 provides a clean, pressurized environment to minimize risk of contamination of substrates being processed as they are moved between various reactor modules. Mounted on the transfer module 403 is a multi-station reactor 409 capable of performing atomic layer deposition (ALD), and sequential CVD according to embodiments. Multi-station reactor 409 may also be used to perform fluorine-free tungsten deposition and/or non-sequential CVD in some embodiments. Reactor 409 may include multiple stations 411, 413, 415, and 417 that may sequentially perform operations in accordance with disclosed embodiments. For example, reactor 409 could be configured such that station 411 performs a first sequential CVD operation using a chlorine-containing tungsten precursor, station 413 performs a second sequential CVD operation, station 415 performs fluorine-free tungsten deposition, and station 417 performs non-sequential CVD. Stations may include a heated pedestal or substrate support, one or more gas inlets or showerhead or dispersion plate. An example of a deposition station 500 is depicted in FIG. 5, including substrate support 502 and showerhead 503. A heater may be provided in pedestal portion 501.

Also mounted on the transfer module 403 may be one or more single or multi-station modules 407 capable of performing plasma or chemical (non-plasma) pre-cleans. The module may also be used for various treatments to, for example, prepare a substrate for a deposition process. The system 400 also includes one or more wafer source modules 401, where wafers are stored before and after processing. An atmospheric robot (not shown) in the atmospheric transfer chamber 419 may first remove wafers from the source modules 401 to loadlocks 421. A wafer transfer device (generally a robot arm unit) in the transfer module 403 moves the wafers from loadlocks 421 to and among the modules mounted on the transfer module 403.

In various embodiments, a system controller 429 is employed to control process conditions during deposition. The controller 429 will typically include one or more memory devices and one or more processors. A processor may include a CPU or computer, analog and/or digital input/output connections, stepper motor controller boards, etc.

The controller 429 may control all of the activities of the deposition apparatus. The system controller 429 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 429 may be employed in some embodiments.

Typically there will be a user interface associated with the controller 429. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 429. The signals for controlling the process are output on the analog and digital output connections of the deposition apparatus 400.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 429 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 429, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 429, in some implementations, may be a part of or coupled to a computer that is integrated with, coupled to the system, otherwise networked to the system, or a combination thereof. For example, the controller 429 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 429 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Figure 6:
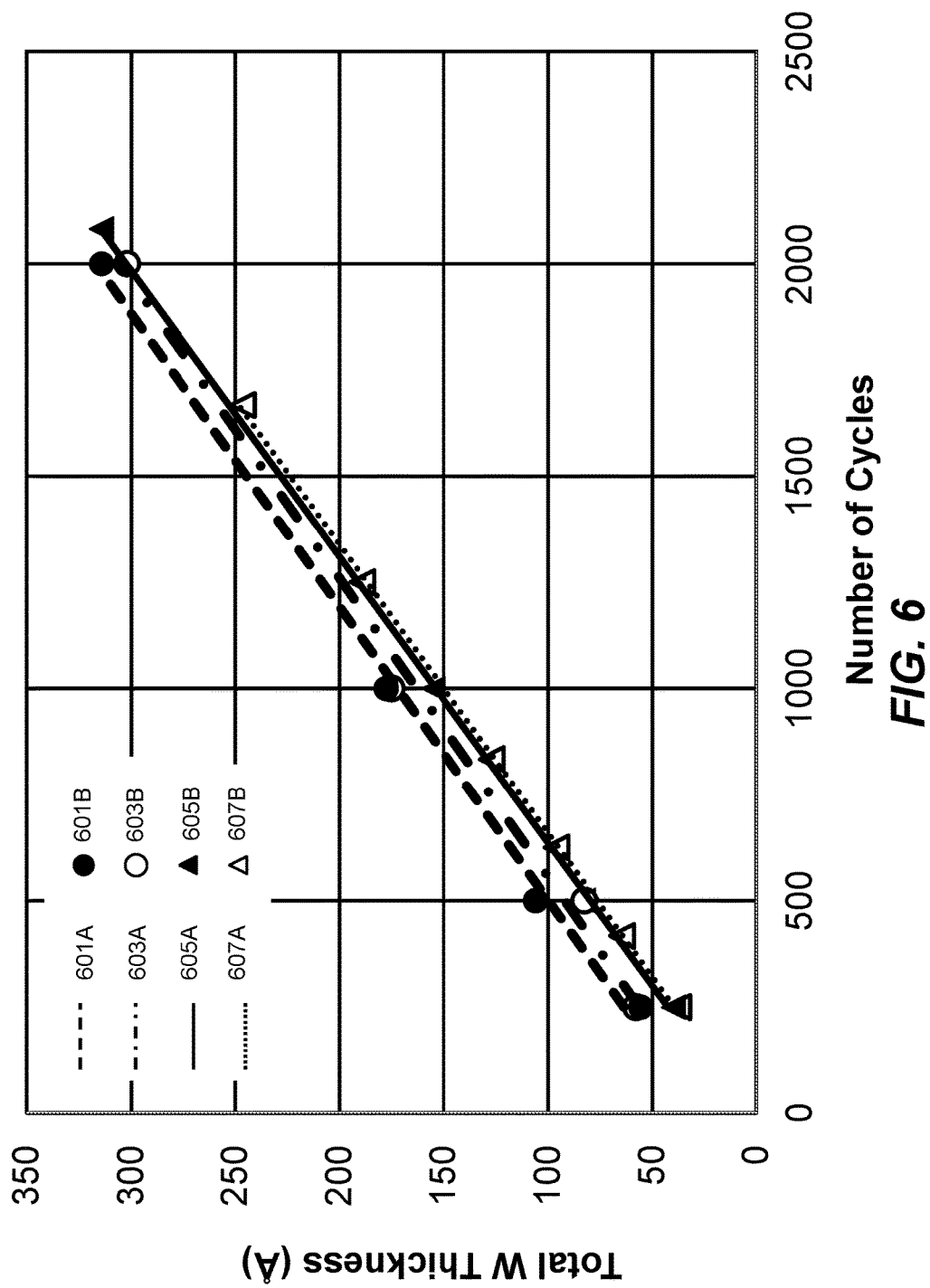
FIG. 6 is a graph of experimental results showing total tungsten deposited as a function of cycles.

An experiment was conducted on four substrates and the thickness of the tungsten deposited on each substrate was measured. The results are shown in FIG. 6.

The first substrate was exposed to alternating pulses of SiH₄ and WCl$_x$ until a tungsten nucleation layer was deposited to a thickness of 30 Å at a chamber pressure of 5 Torr and a substrate temperature of 450° C. using 5% SiH₄ and 85% H₂ during the SIH₄ pulse, and 0.5% WCl$_x$ precursor in argon during the WCl$_x$ pulse. The substrate was then exposed to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The thickness is represented by plots 601B and trend line 601A.

The second substrate was exposed to alternating pulses of SiH₄ and WCl$_x$ until a tungsten nucleation layer was deposited to a thickness of 10 Å at a chamber pressure of 5 Torr and a substrate temperature of 450° C. using 5% SiH₄ and 85% H₂ during the SIH₄ pulse, and 0.5% WCl$_x$ precursor in argon during the WCl$_x$ pulse. The substrate was then exposed to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The thickness is represented by plots 603B and trend line 603A.

The third substrate was sputtered with tungsten using PVD and then exposed to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The thickness is represented by plots 605B and trend line 605A.

The fourth substrate having a TiN surface was exposed to alternating pulses of H₂ and WCl$_x$ to deposit bulk tungsten without treatment and without depositing a nucleation layer at a chamber pressure of 5 Torr and a substrate temperature of 525° C. using >90% H₂ during the H₂ pulse and 0.7% tungsten precursor in argon during the WCl$_x$ pulse. The thickness is represented by plots 607B and trend line 607A.

A growth rate of zero is typical and expected for forming tungsten on TiN without nucleation using alternating pulses of H₂ and WF₆ and thus, such deposition using H₂ and WF₆ usually involve deposition of a tungsten nucleation layer or pre-soak operation using B₂H₆ to grow tungsten. Surprisingly, the results in FIG. 6 suggest that tungsten growth rate is substrate and nucleation independent with exposing the substrate to alternating pulses of H₂ and WCl$_x$ without soak or nucleation layer deposition.

Experiment 2

An experiment was conducted on four substrates and the resistivity of the tungsten deposited on each substrate was measured at various thicknesses. The results are shown in FIG. 7.

The first substrate was exposed to 3 cycles of alternating pulses of SiH₄ and WF₆ and 3 cycles of alternating pulses of B₂H₆ and WF₆ until a tungsten nucleation layer was deposited to a thickness of 20 Å. Subsequently, bulk tungsten was deposited over the tungsten nucleation layer by exposing the nucleation layer to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The resistivity was measured at various thicknesses of the deposited tungsten and is depicted in FIG. 7 as 701.

The second substrate having a TiN surface was exposed to alternating pulses of H₂ and WCl$_x$ to deposit bulk tungsten without treatment and without depositing a nucleation layer at a chamber pressure of 5 Torr and a substrate temperature of 525° C. using >90% H₂ during the H₂ pulse and 0.7% tungsten precursor in argon during the WCl$_x$ pulse. The resistivity was measured at various thicknesses of the deposited tungsten and is depicted in FIG. 7 as 703.

The third substrate was exposed to alternating pulses of SiH₄ and WCl$_x$ until a tungsten nucleation layer was deposited to a thickness of 30 Å at a chamber pressure of 5 Torr and a substrate temperature of 450° C. using 5% SiH₄ and 85% H₂ during the SIH₄ pulse, and 0.5% WCl$_x$ precursor in argon during the WCl$_x$ pulse. The substrate was then exposed to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The resistivity was measured at various thicknesses of the deposited tungsten and is depicted in FIG. 7 as 704.

The fourth substrate was exposed to alternating pulses of SiH₄ and WCl$_x$ until a tungsten nucleation layer was deposited to a thickness of 10 Å at a chamber pressure of 5 Torr and a substrate temperature of 450° C. using 5% SiH₄ and 85% H₂ during the SIH₄ pulse, and 0.5% WCl$_x$ precursor in argon during the WCl$_x$ pulse. The substrate was then exposed to alternating pulses of H₂ and WCl$_x$ to deposit bulk tungsten at a chamber pressure of 5 Torr and a substrate temperature of 525° C. using >90% H₂ during the H₂ pulse and 0.7% tungsten precursor in argon during the WCl$_x$ pulse. The resistivity was measured at various thicknesses of the deposited tungsten and is depicted in FIG. 7 as 705.

These results indicate that presence of a nucleation layer and the type of substrate that is exposed to the alternating pulses of H₂ and WCl$_x$ strongly affects the resistivity of the tungsten film. For example, for less than 50 Å of deposited tungsten, films deposited using no nucleation (704) and thin nucleation (30A) deposited using WCl$_x$ had lower resistivity. This may be due to a grain growth template effect (that is, the surface upon which the tungsten is being deposited affects the size of grains grown on the substrate). For resistivity of films measured at a thickness of greater than 50 Å, films having no nucleation or little nucleation deposited by WCl$_x$, followed by alternating pulses of WCl$_x$ and H₂ (shown in 703, 704, and 705) have higher resistivity, which may be due to tungsten crystal size template effect. The lowest resistivity for thicknesses greater than 50 Å as shown in FIG. 7 was found in films deposited using WF₆ and reducing agents for nucleation layer, followed by alternating pulses of WCl$_x$ and H₂, possibly due to the nucleation layer deposition creating favorable growth templates to generate large tungsten crystals. At lower thicknesses (<50 Å), however, the resistivity is much higher than the other substrates. These results suggest that the deposition process using alternating pulses of WCl$_x$ and a reducing agent can be modulated to promote large tungsten grain size growth. In some cases, it may be suitable to use a nucleation layer using B₂H₆ and/or SiH₄ and WCl$_x$ prior to depositing using alternating pulses of WCl$_x$ and H₂. However, these results also indicate that deposition without any nucleation layer, which can promote efficiency and increased throughput, also yield comparable results suitable for use in depositing bulk tungsten directly on a substrate.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of filling a feature comprising:
   (a) providing a substrate in a chamber, the substrate comprising the feature having an untreated surface comprising a metal; and
   (b) without treating the untreated surface of the feature and without depositing a tungsten nucleation layer in the feature, exposing the untreated surface to cycles of alternating pulses of hydrogen and a chlorine-containing tungsten precursor introduced to the chamber to deposit bulk tungsten directly on the untreated surface.

2. The method of claim 1, wherein the chlorine-containing tungsten precursor is selected from the group consisting of tungsten hexachloride and tungsten pentachloride.

3. The method of claim 1, wherein a pulse of the chlorine-containing tungsten precursor comprises between about 0.1% and about 1.5% of chlorine-containing tungsten precursor by volume.

4. The method of claim 1, wherein the chamber is purged between each pulse of the hydrogen and the chlorine-containing tungsten precursor.

5. The method of claim 1, wherein the bulk tungsten is deposited to a thickness of less than about 50 Å and resistivity of the bulk tungsten is less than about 150 µΩ-cm.

6. A method of filling a feature comprising:
   (a) providing a substrate in a chamber, the substrate comprising the feature; and
   (b) exposing the substrate to cycles of alternating pulses of hydrogen and a chlorine-containing tungsten precursor introduced to the chamber to deposit bulk tungsten directly in the feature without depositing a tungsten nucleation layer,
   wherein pressure of the chamber is no more than 10 Torr.

7. The method of claim 6, further comprising, (c) prior to exposing the substrate to the alternating pulses of the hydrogen and the chlorine-containing tungsten precursor, exposing the substrate to a reducing agent for a soak treatment.

8. The method of claim 6, further comprising, (c) prior to exposing the substrate to the alternating pulses of the hydrogen and the chlorine-containing tungsten precursor, exposing the substrate to alternating pulses of a reducing agent and the chlorine-containing tungsten precursor to deposit a tungsten nucleation layer on the substrate.

9. The method of claim 6, wherein each cycle forms a submonolayer of the bulk tungsten having a thickness of at least about 0.3 Å.

10. The method of claim 6, wherein the chlorine-containing tungsten precursor is tungsten hexachloride.

11. The method of claim 6, wherein the chlorine-containing tungsten precursor is tungsten pentachloride.

12. The method of claim 6, wherein the bulk tungsten is deposited at a substrate temperature between about 400° C. and about 600° C.

13. The method of claim 6, wherein the chamber is purged between each pulse of the hydrogen and the chlorine-containing tungsten precursor.

14. The method of claim 6, wherein each purge is performed for a duration between about 0.25 seconds and about 30 seconds.

15. The method of claim 6, wherein a pulse of the chlorine-containing tungsten precursor comprises between about 0.1% and about 1.5% of chlorine-containing tungsten precursor by volume.

16. The method of claim 6, wherein the bulk tungsten is deposited to a thickness of less than about 50 Å and resistivity of the bulk tungsten is less than about 150 µΩ-cm.

17. A method of filling a feature comprising:
   (a) providing a substrate in a chamber, the substrate comprising the feature, the feature comprising a metal-containing surface;
   (b) exposing the metal-containing surface to cycles of alternating pulses of hydrogen and a chlorine-containing tungsten precursor introduced to the chamber to deposit bulk tungsten in the feature without depositing a tungsten nucleation layer; and
   (c) prior to exposing the metal-containing surface to the alternating pulses of the hydrogen and the chlorine-containing tungsten precursor, exposing the metal-containing surface to a reducing agent for a soak treatment.

18. The method of claim 17, wherein a pulse of the chlorine-containing tungsten precursor comprises between about 0.1% and about 1.5% of chlorine-containing tungsten precursor by volume.

19. The method of claim 17, wherein the bulk tungsten is deposited at a substrate temperature between about 400° C. and about 600° C.

20. The method of claim 17, wherein the chamber is purged between each pulse of the reducing agent and the chlorine-containing tungsten precursor.

21. The method of claim 17, wherein each purge is performed for a duration between about 0.25 seconds and about 30 seconds.

22. The method of claim 17, wherein the reducing agent is selected from the group consisting of germane ($GeH_4$), argon (Ar), tungsten hexafluoride ($WF_6$), diborane ($B_2H_6$), hydrogen ($H_2$), nitrogen ($N_2$) gas, and combinations thereof.

23. The method of claim 17, wherein the bulk tungsten is deposited to a thickness of less than about 50 Å and resistivity of the bulk tungsten is less than about 150 µΩ-cm.

* * * * *